(12) United States Patent
Soda et al.

(10) Patent No.: US 10,170,433 B2
(45) Date of Patent: Jan. 1, 2019

(54) INSULATED CIRCUIT BOARD, POWER MODULE AND POWER UNIT

(71) Applicant: Mitsubishi Electric Corporation, Chiyoda-ku (JP)

(72) Inventors: Shinnosuke Soda, Chiyoda-ku (JP); Yohei Omoto, Chiyoda-ku (JP); Komei Hayashi, Chiyoda-ku (JP); Shinji Tsukamoto, Chiyoda-ku (JP); Yasumichi Hatanaka, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/533,245

(22) PCT Filed: Oct. 13, 2015

(86) PCT No.: PCT/JP2015/078874
§ 371 (c)(1),
(2) Date: Jun. 5, 2017

(87) PCT Pub. No.: WO2016/098431
PCT Pub. Date: Jun. 23, 2016

(65) Prior Publication Data
US 2017/0338189 A1    Nov. 23, 2017

(30) Foreign Application Priority Data

Dec. 18, 2014 (JP) .................................. 2014-256431

(51) Int. Cl.
*H01L 23/00* (2006.01)
*H01L 25/18* (2006.01)
(Continued)

(52) U.S. Cl.
CPC ............ *H01L 23/562* (2013.01); *H01L 23/13* (2013.01); *H01L 23/3114* (2013.01);
(Continued)

(58) Field of Classification Search
CPC ............... H01L 29/4236; H01L 21/761; H01L 27/10814; H01L 27/10855; H01L 27/10876; H01L 27/10891
See application file for complete search history.

(56) References Cited

U.S. PATENT DOCUMENTS

| 6,426,154 B1 | 7/2002 | Naba et al. |
| 2008/0291636 A1 | 11/2008 | Mori et al. |
| 2015/0108501 A1* | 4/2015 | Iwamuro ............. H01L 29/1608 257/77 |

FOREIGN PATENT DOCUMENTS

| JP | 01-059986 A | 3/1989 |
| JP | 64-59986 A | 3/1989 |

(Continued)

OTHER PUBLICATIONS

Decision on Opposition dated Jan. 29, 2018 in Japanese Patent No. 6033522 with English translation.
(Continued)

*Primary Examiner* — Ratisha Mehta
(74) *Attorney, Agent, or Firm* — Oblon, McClelland, Maier & Neustadt, L.L.P.

(57) ABSTRACT

An insulated circuit board includes an insulated substrate, a first electrode, and a second electrode. A thin portion is formed in a corner portion, the corner portion being a region occupying, with regard to directions along outer edges from a vertex of at least one of the first and second electrodes in plan view, a portion of a length of the outer edges, and the thin portion has a thickness smaller than that of a region other than the thin portion. The thin portion in at least one of the first and second electrodes has a planar shape surrounded by first and second sides orthogonal to each other as portions of the outer edges from the vertex, and a curved portion away from the vertex of the first and second sides.

20 Claims, 18 Drawing Sheets

(51) Int. Cl.
H01L 25/07 (2006.01)
H01L 25/11 (2006.01)
H01L 23/367 (2006.01)
H01L 23/373 (2006.01)
H01L 23/13 (2006.01)
H01L 23/31 (2006.01)

(52) U.S. Cl.
CPC ...... *H01L 23/3672* (2013.01); *H01L 23/3735* (2013.01); *H01L 24/32* (2013.01); *H01L 25/072* (2013.01); *H01L 25/115* (2013.01); *H01L 25/18* (2013.01); *H01L 23/3121* (2013.01); *H01L 24/29* (2013.01); *H01L 24/33* (2013.01); *H01L 24/37* (2013.01); *H01L 24/40* (2013.01); *H01L 24/84* (2013.01); *H01L 2224/291* (2013.01); *H01L 2224/32155* (2013.01); *H01L 2224/32225* (2013.01); *H01L 2224/32245* (2013.01); *H01L 2224/33181* (2013.01); *H01L 2224/37147* (2013.01); *H01L 2224/37599* (2013.01); *H01L 2224/40137* (2013.01); *H01L 2224/84801* (2013.01); *H01L 2924/0002* (2013.01); *H01L 2924/1033* (2013.01); *H01L 2924/10253* (2013.01); *H01L 2924/10254* (2013.01); *H01L 2924/10272* (2013.01); *H01L 2924/1203* (2013.01); *H01L 2924/13055* (2013.01); *H01L 2924/14252* (2013.01); *H01L 2924/181* (2013.01)

(56) References Cited

FOREIGN PATENT DOCUMENTS

| | | | |
|---|---|---|---|
| JP | 05-025397 B2 | 4/1993 | |
| JP | 08-274423 A | 10/1996 | |
| JP | 09-283703 A | 10/1997 | |
| JP | 10-4156 A | 1/1998 | |
| JP | 10004156 A * | 1/1998 | ......... H01L 23/3735 |
| JP | 2001-168482 A | 6/2001 | |
| JP | 2004134746 A * | 4/2004 | |
| JP | 2006-140401 A | 6/2006 | |
| JP | 2008-294284 A | 12/2008 | |
| JP | 2014-118310 A | 6/2014 | |

OTHER PUBLICATIONS

Office Action dated Aug. 28, 2017 in Japanese Patent Application No. 2017-700529 (with English translaiton).
Japanese Office Action dated Jun. 29, 2017 in Japanese Patent Application No. 2017-700529 (with English translation).
International Search Report dated Dec. 22, 2015 in PCT/JP2015/078874, filed Oct. 13, 2015.

* cited by examiner

FIG.1
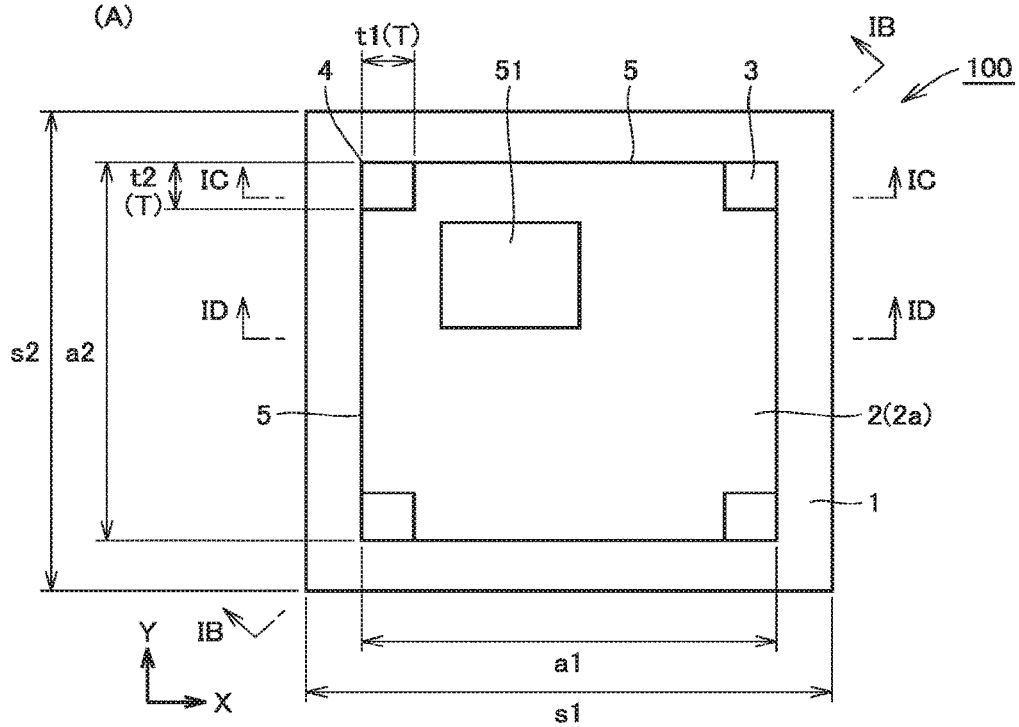
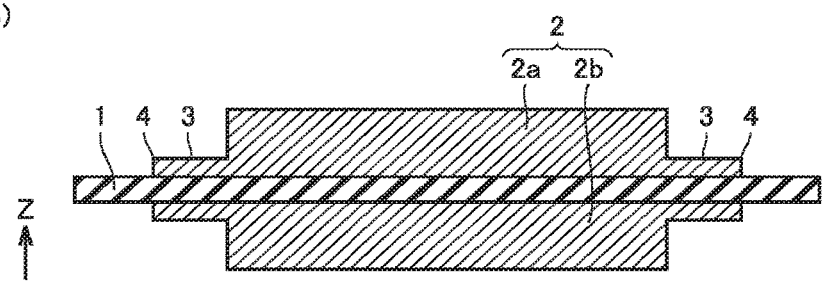
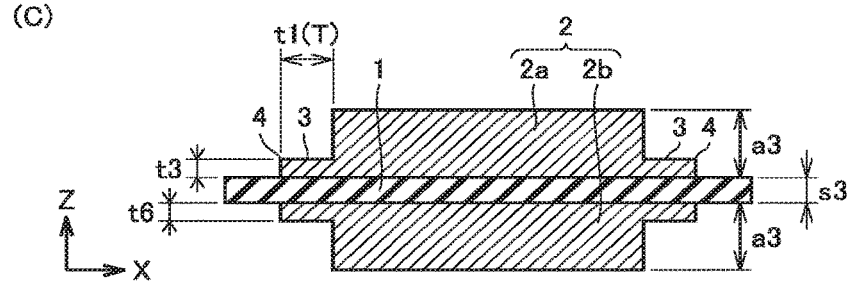
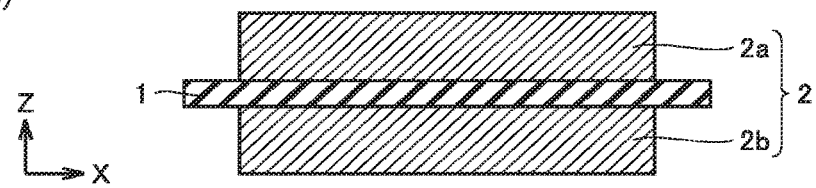

FIG.3
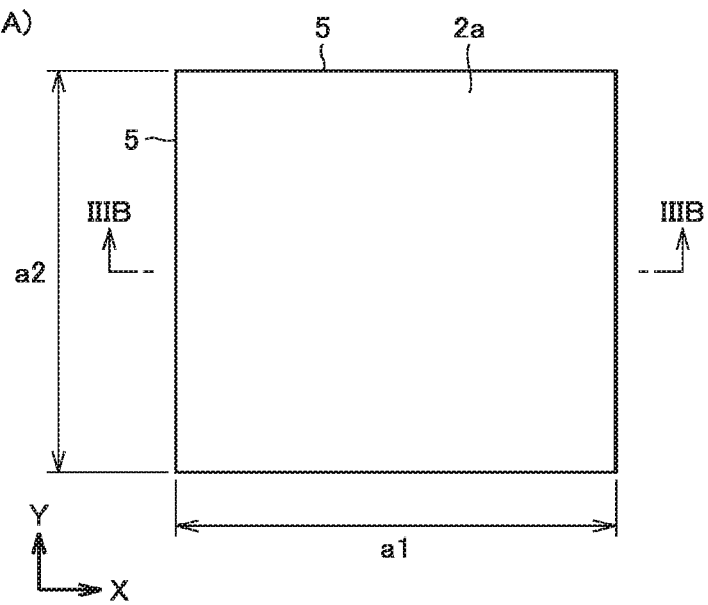
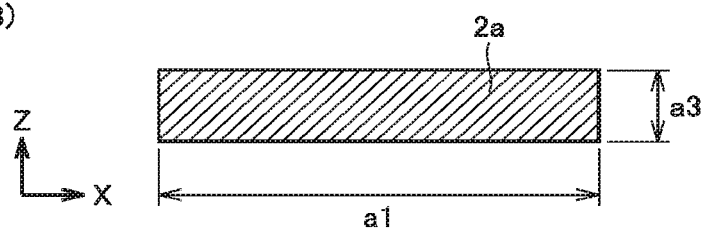

FIG.14
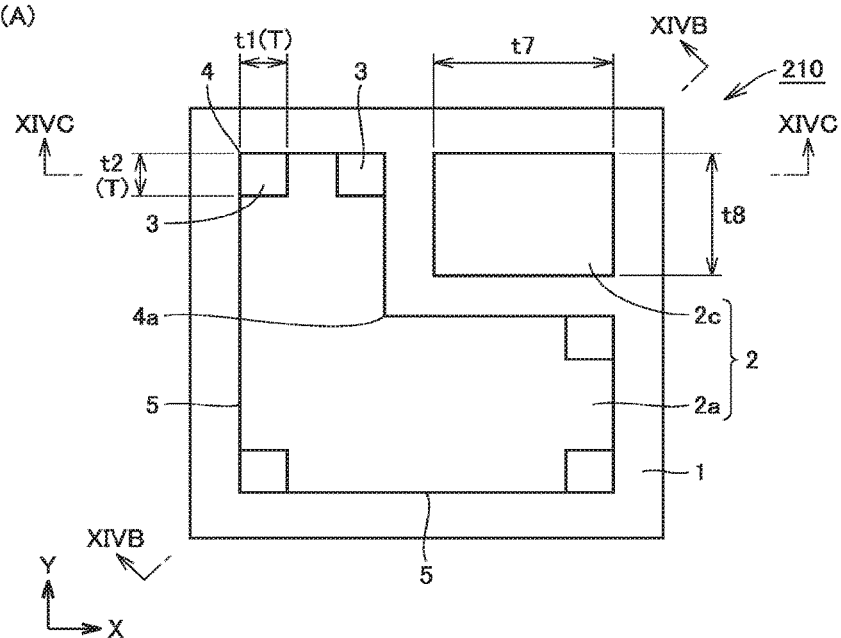
(A)
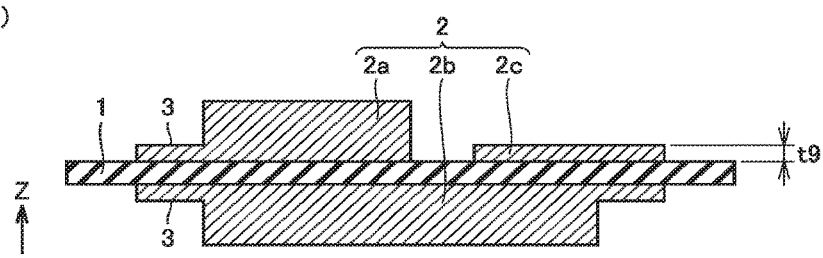
(B)
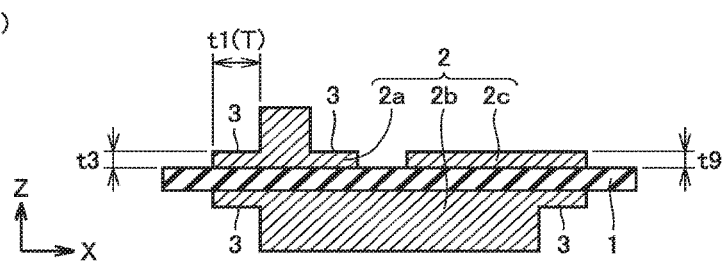
(C)

FIG.15
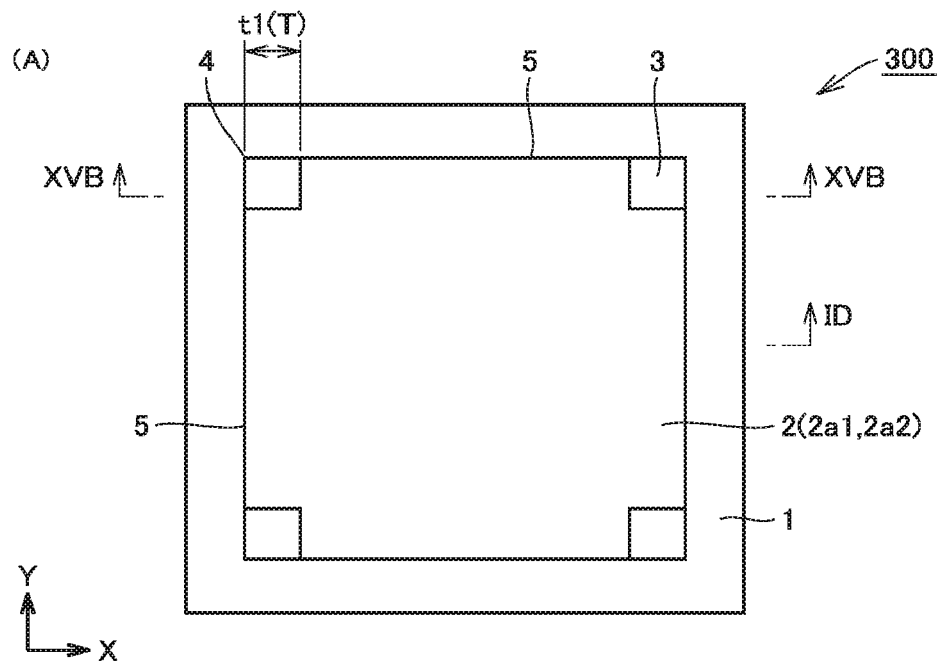
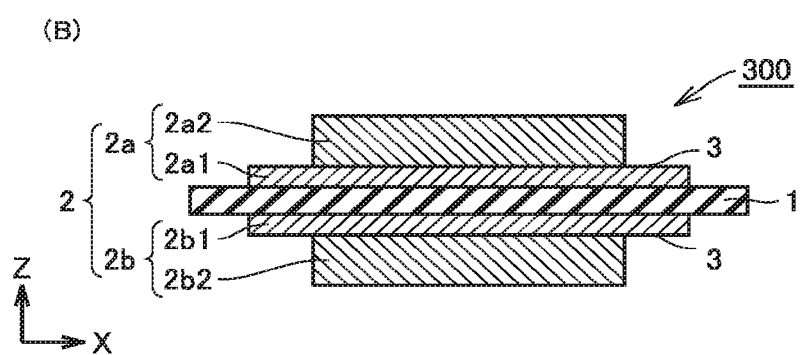

INSULATED CIRCUIT BOARD, POWER MODULE AND POWER UNIT

TECHNICAL FIELD

The present invention relates to an insulated circuit board included in power electronics equipment, as well as a power module and a power unit including this insulated circuit board.

BACKGROUND ART

An insulated circuit board used in a semiconductor power module has a structure in which a circuit electrode is joined to one main surface and the other main surface of an insulated substrate made of ceramic. With the recent increase in current density and higher temperature operation of power modules, it has been considered to increase the thickness of the circuit electrode for the purpose of reducing electrical resistance and thermal resistance.

If the thickness of a circuit electrode is increased, when a thermal shock cycle is applied to a power module including this circuit electrode, breakage of an insulated substrate and peeling off of the circuit electrode may occur due to thermal stress caused by a difference in thermal expansion coefficient between the insulated substrate and the circuit electrode.

To address such issues that may arise due to the increased thickness of a circuit electrode, Japanese Patent Publication No. 5-25397 (PTD 1), for example, proposes a technique in which an outer edge portion of a circuit electrode is formed to have a stepped shape, so that the circuit electrode has a smaller thickness at this stepped-shaped portion than at a portion other than the stepped-shaped portion. Japanese Patent Laying-Open No. 8-274423 (PTD 2), for example, proposes a technique in which a plurality of discontinuous trenches are provided in the vicinity of an outer edge portion of a circuit electrode.

CITATION LIST

Patent Documents

PTD 1: Japanese Patent Publication No. 5-25397
PTD 2: Japanese Patent Laying-Open No. 8-274423

SUMMARY OF INVENTION

Technical Problem

One problem with an insulated circuit board proposed in Japanese Patent Publication No. 5-25397 is that, although thermal stress is reduced at the outer edge portion of the circuit electrode, the cross-sectional area of a region through which the heat diffuses decreases due to the reduced thickness of the outer edge portion of the circuit electrode, resulting in increased thermal resistance. One problem with an insulated circuit board proposed in Japanese Patent Laying-Open No. 8-274423 is that, although increase in thermal resistance is reduced as compared to the insulated circuit board of Japanese Patent Publication No. 5-25397, the effect of reducing thermal stress at the outer edge portion of the electrode is small, resulting in inability to sufficiently suppress peeling off of the electrode. This is based on the fact that a trench is not formed in the outer edge portion of the electrode, so the thickness of the electrode is not reduced. When reducing the cross-sectional area of a circuit electrode in this manner, thermal stress and thermal resistance have a trade-off relationship.

The present invention was made in view of the above-described problems, and has an object to provide an insulated circuit board in which increase in thermal stress due to application of a thermal shock cycle is suppressed, and increase in thermal resistance is suppressed, as well as a power module and a power unit including this insulated circuit board.

Solution to Problem

An insulated circuit board of the present invention includes an insulated substrate, a first electrode, and a second electrode. The first electrode is formed on one main surface of the insulated substrate, and has a polygonal shape in plan view. The second electrode is formed on the other main surface opposite to the one main surface of the insulated substrate, and has a polygonal shape in plan view. A thin portion is formed in a corner portion, the corner portion being a region occupying, with regard to directions along outer edges from a vertex of at least one of the first and second electrodes in plan view, a portion of a length of the outer edges, and the thin portion has a thickness smaller than that of a region other than the thin portion. The thin portion in at least one of the first and second electrodes has a planar shape surrounded by first and second sides orthogonal to each other as portions of the outer edges from the vertex, and a curved portion away from the vertex of the first and second sides.

An insulated circuit board of the present invention includes an insulated substrate, a first electrode, and a second electrode. The first electrode is formed on one main surface of the insulated substrate, and has a polygonal shape in plan view. The second electrode is formed on the other main surface opposite to the one main surface of the insulated substrate, and has a polygonal shape in plan view. A thin portion is formed in a corner portion, the corner portion being a region occupying, with regard to directions along outer edges from a vertex of at least one of the first and second electrodes in plan view, a portion of a length of the outer edges, and the thin portion has a thickness smaller than that of a region other than the thin portion. The thin portion in at least one of the first and second electrodes has a triangular shape in plan view surrounded by first and second sides orthogonal to each other as portions of the outer edges from the vertex, and a third side extending in a direction inclined with respect to the first and second sides so as to connect the vertex of the first and second sides to an opposite end portion.

Advantageous Effects of Invention

According to the present invention, since the thin portion is provided in the corner portion of the first and second electrodes, increase in thermal stress in the first and second electrodes is suppressed even when the thickness of these electrodes is increased. Peeling off of the first and second electrodes caused by increased thermal stress can thereby be suppressed, and increase in thermal resistance can be suppressed. The insulated circuit board thereby has improved reliability.

BRIEF DESCRIPTION OF DRAWINGS

FIG. 1 shows a schematic plan view (A) showing the configuration of an insulated circuit board of a first embodiment as seen from the side of a surface electrode, a schematic sectional view (B) of a portion taken along the line IB-IB of FIG. 1(A), a schematic sectional view (C) of a portion taken along the line IC-IC of FIG. 1(A), and a schematic sectional view (D) of a portion taken along the line ID-ID of FIG. 1(A).

FIG. 3 shows a schematic plan view (A) of the surface electrode not having a thin portion formed therein, and a schematic sectional view (B) of a portion taken along the line IIIB-IIIB of FIG. 3(A).

FIG. 14 shows a schematic plan view (A) showing the configuration of an insulated circuit board of a modification of the second embodiment as seen from the side of the surface electrode, a schematic sectional view (B) of a portion taken along the line XIVB-XIVB of FIG. 14(A), and a schematic sectional view (C) of a portion taken along the line XIVC-XIVC of FIG. 14(A).

FIG. 15 shows a schematic plan view (A) showing the configuration of an insulated circuit board of a third embodiment as seen from the side of the surface electrode, and a schematic sectional view (B) of a portion taken along the line XVB-XVB of FIG. 15(A).

DESCRIPTION OF EMBODIMENTS

Embodiments of the present invention will be described below based on the drawings.

First Embodiment

Figure 2:
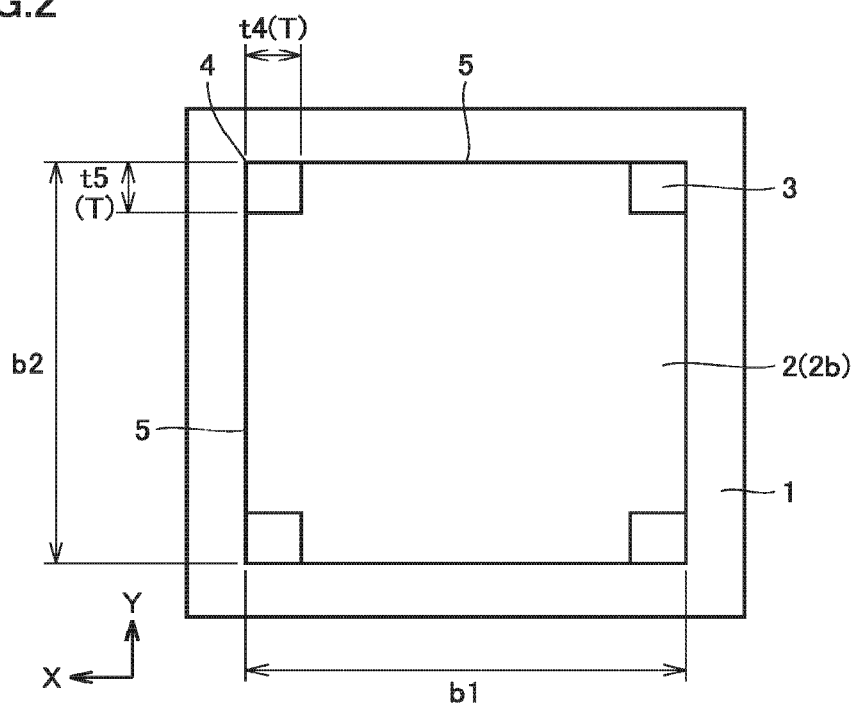
FIG. 2 is a schematic plan view showing the configuration of the insulated circuit board of the first embodiment as seen from the side of a backside electrode.

First, the configuration of an insulated circuit board 100 of the present embodiment is described using FIGS. 1 and 2. It is noted that an X direction, a Y direction and a Z direction are introduced for the purpose of illustration. In addition, all dimensional values such as thickness herein are represented as overall average values whose local variations are ignored.

Referring to FIG. 1(A), (B), (C) and FIG. 2, insulated circuit board 100 of the present embodiment has an insulated substrate 1 and an electrode 2, and electrode 2 has a surface electrode 2*a* (first electrode) and a backside electrode 2*b* (second electrode).

Insulated substrate 1 is a plate-like member having a rectangular shape in plan view, for example. Here, insulated substrate 1 is made of a ceramic material such as aluminum nitride. However, aluminum oxide or silicon nitride may be used as a material forming insulated substrate 1. Here, by way of example, a dimension s1 of insulated substrate 1 in the X direction corresponding to the horizontal direction in FIG. 1(A) is 20 mm, a dimension s2 of insulated substrate 1 in the Y direction corresponding to the vertical direction (orthogonal to the X direction) in FIG. 1(A) is 20 mm, and a dimension (thickness) s3 of insulated substrate 1 in the Z direction corresponding to the vertical direction (orthogonal to the X and Y directions) in FIG. 1(B) is 0.32 mm.

Surface electrode 2*a* is formed on one, that is, for example, upper, main surface of insulated substrate 1 as shown in FIG. 1(B). Backside electrode 2*b* is formed on the other, that is, for example, lower, main surface of insulated substrate 1 as shown in FIG. 1(B). Surface electrode 2*a* and backside electrode 2*b* basically have a polygonal shape in plan view, but both have a square shape here.

It is preferred that, in surface electrode 2*a* and backside electrode 2*b*, basically as a normal range of use, a dimension a1 in the X direction and a dimension a2 in the Y direction of surface electrode 2*a*, as well as a dimension b1 in the X direction and a dimension b2 in the Y direction of backside electrode 2*b* be set to not less than 10 mm (particularly not less than 10 mm and not more than 100 mm). Here, by way of example, dimension a1 in the X direction and dimension a2 in the Y direction of surface electrode 2*a*, as well as dimension b1 in the X direction and dimension b2 in the Y direction of backside electrode 2*b* are each 18 mm, and the dimensions (thicknesses) a3 and b3 in the Z direction of surface electrode 2*a* and backside electrode 2*b*, respectively, are each 1 mm. Surface electrode 2*a* and backside electrode 2*b* are each made of copper, for example, but this is not limiting, and they may be made of aluminum or silver, for example.

As will be described later, in an actual power module, a power semiconductor element 51 (a semiconductor chip with a semiconductor element formed thereon) is connected to (mounted on) the surface of surface electrode 2a by a solder joint layer, for example.

Each of surface electrode 2a and backside electrode 2b has corner thin portions 3 (thin portions) formed in its corner portions. Corner thin portion 3 is a region having a smaller thickness in the Z direction than the other region (other than corner thin portion 3) in surface electrode 2a. A dimension t1 in the X direction and a dimension t2 in the Y direction of corner thin portion 3 of surface electrode 2a are each 2 mm, and a thickness t3 in the Z direction of corner thin portion 3 is 0.3 mm. Similarly, a dimension t4 in the X direction and a dimension t5 in the Y direction of corner thin portion 3 of backside electrode 2b are each 2 mm, and a thickness t6 in the Z direction of corner thin portion 3 is 0.3 mm. In this manner, in the present embodiment, corner thin portion 3 has a square shape in plan view in both surface electrode 2a and backside electrode 2b.

The "corner portion" as used herein means a region which includes a vertex 4 forming the polygonal shape of each of surface electrode 2a and backside electrode 2b, and which is within the range of coordinates of a portion with regard to the directions (the X direction and the Y direction) along outer edges 5 forming the sides of the polygonal shape from vertex 4. In other words, the corner portion is a region occupying only the length (for example, 2 mm) of a portion of the length of outer edges 5 (18 mm) with regard to the X direction and the Y direction from vertex 4. Accordingly, corner thin portion 3 is formed within the range of the corner portion which includes one vertex 4, and which is formed to be continuous with vertex 4 so as to occupy only a region corresponding to a very short length relative to the length of outer edges 5 with regard to the X direction and the Y direction from that vertex 4.

Stated in still another way, the corner portion is formed only in a region relatively close to vertex 4, so as not to occupy the whole (equal to 18 mm) in the directions along outer edges 5 from vertex 4. Accordingly, corner thin portion 3 is formed only in a region relatively close to vertex 4.

Next, using FIGS. 3 to 6, a function and effect produced by forming corner thin portions 3 in the corner portions of surface electrode 2a and backside electrode 2b as described above, and a preferred dimension of corner thin portions 3 will be described. It is noted that although the description will entirely be given here only for surface electrode 2a, the same basically applies to backside electrode 2b as well. In addition, all conditions for a thermal shock cycle test are the same among data below.

Referring to FIGS. 3(A) and (B), in this surface electrode 2a, dimension a1 in the X direction and dimension a2 in the Y direction are each 18 mm as with surface electrode 2a of FIG. 1(A), and thickness a3 in the Z direction is varied from 0.2 mm to 1.6 mm. In addition, this surface electrode 2a does not have corner thin portions 3 formed therein, and has a substantially constant thickness a3 as a whole. All the other conditions are similar to those of insulated circuit board 100 of FIG. 1.

Table 1 below shows results of experiments in which it was determined whether or not peeling off of surface electrode 2a from insulated substrate 1 occurred when a thermal shock cycle test was conducted on an insulated circuit board having surface electrode 2a shown in FIG. 3 formed on one main surface of insulated substrate 1. It is noted that the thermal shock cycle test was conducted by applying a load to surface electrode 2a, in which surface electrode 2a was repeatedly subjected to temperature increase and decrease between 40° C. below zero and 175° C.

TABLE 1

| Thickness of surface electrode 2a | Whether electrode 2a was peeled off from insulated substrate 1 |
| --- | --- |
| 0.2 mm | ○ (Not peeled off) |
| 0.3 mm | ○ (Not peeled off) |
| 0.4 mm | ○ (Not peeled off) |
| 0.6 mm | x (Peeled off) |
| 0.8 mm | x (Peeled off) |
| 1.0 mm | x (Peeled off) |
| 1.2 mm | x (Peeled off) |
| 1.5 mm | x (Peeled off) |
| 1.6 mm | x (Peeled off) |

It can be seen from Table 1 that surface electrode 2a is peeled off from insulated substrate 1 when the thickness of surface electrode 2a reaches not less than 0.6 mm.

Referring now to FIGS. 4(A) and (B), in this surface electrode 2a, dimension a1 in the X direction and dimension a2 in the Y direction are each 18 mm as with surface electrode 2a of FIG. 1(A), and thickness a3 in the Z direction of a region other than a peripheral thin portion 6 is varied from 0.2 mm to 1.6 mm. In other words, this surface electrode 2a has peripheral thin portion 6 formed along its outer edges 5 in the entire outer edge portion in the vicinity of outer edges 5 (so as to go around the outer edge portion of surface electrode 2a). Peripheral thin portion 6 means, as with corner thin portion 3, a region of surface electrode 2a having a smaller thickness in the Z direction than the other region in surface electrode 2a, but is different in that it goes around the outer edge portion so as to occupy the entire length of outer edges 5 with regard to the directions along outer edges 5, from corner thin portion 3 formed only in a portion of the length of outer edges 5 from vertex 4. As such, from the viewpoint of making a distinction from corner thin portion 3, the term "peripheral thin portion 6" different from corner thin portion 3 is employed.

A width p1 of peripheral thin portion 6 with regard to the directions (the X direction and the Y direction) intersecting outer edges 5 is 1.0 mm, and a thickness p2 of peripheral thin portion 6 with regard to the Z direction is 0.3 mm (which is 0.1 mm, however, for samples in which an overall thickness of electrode 2a is 0.2 mm and 0.3 mm). Table 2 below shows results of experiments in which it was determined whether or not peeling off of surface electrode 2a from insulated substrate 1 occurred when a thermal shock cycle test was conducted on an insulated circuit board having surface electrode 2a shown in FIG. 4 formed on one main surface of insulated substrate 1.

TABLE 2

| Thickness of surface electrode 2a | Whether electrode 2a was peeled off from insulated substrate 1 |
| --- | --- |
| 0.2 mm | ○ (Not peeled off) |
| 0.3 mm | ○ (Not peeled off) |
| 0.4 mm | ○ (Not peeled off) |
| 0.6 mm | ○ (Not peeled off) |
| 0.8 mm | ○ (Not peeled off) |
| 1.0 mm | ○ (Not peeled off) |
| 1.2 mm | x (Peeled off) |
| 1.5 mm | x (Peeled off) |
| 1.6 mm | x (Peeled off) |

It can be seen from Table 2 that, in the case where peripheral thin portion 6 is provided, surface electrode 2a is peeled off from insulated substrate 1 when the thickness of surface electrode 2a reaches not less than 1.2 mm.

Referring now to FIGS. 5(A) and (B), in this surface electrode 2a, dimension a1 in the X direction and dimension a2 in the Y direction are each 18 mm as with surface electrode 2a of FIG. 1(A), and thickness a3 in the Z direction of a region of surface electrode 2a other than corner thin portions 3 is varied from 0.2 mm to 1.6 mm. In other words, this surface electrode 2a has corner thin portions 3 formed in its corner portions.

Figure 5:
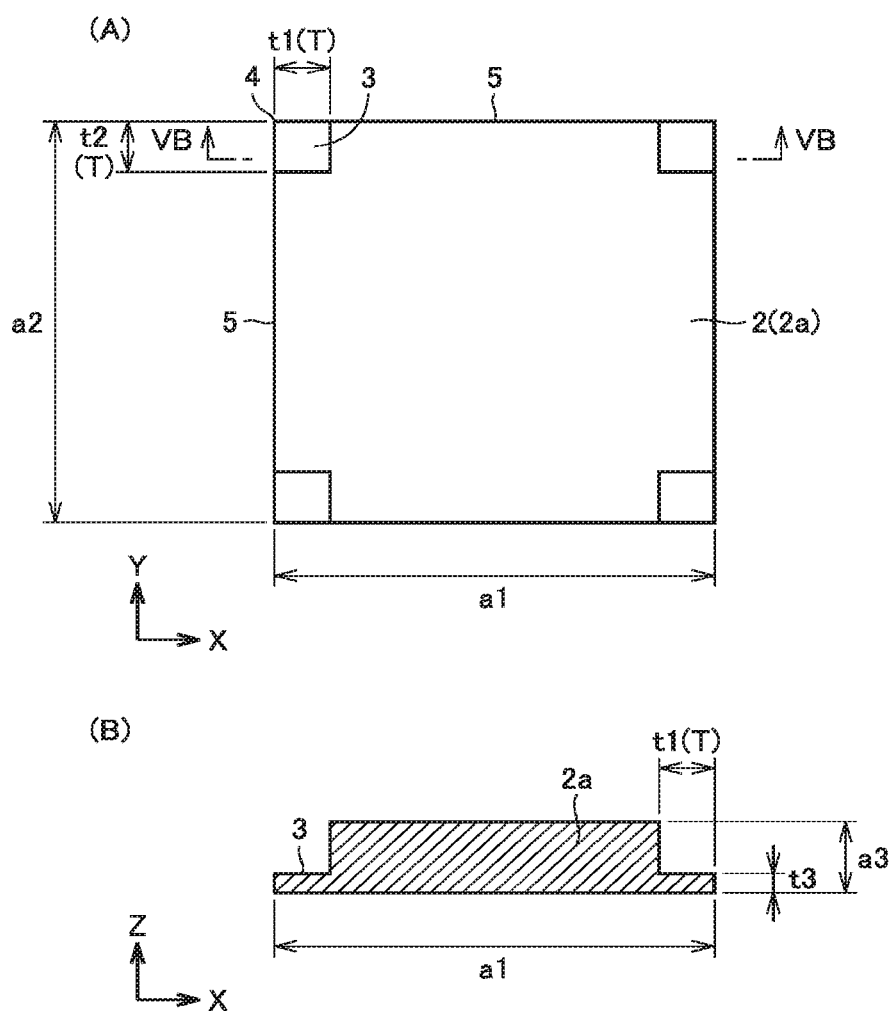
FIG. 5 shows a schematic plan view (A) of the surface electrode having corner thin portions formed therein, and a schematic sectional view (B) of a portion taken along the line VB-VB of FIG. 5(A).

Dimensions t1 and t2 of corner thin portion 3 with regard to the X direction and the Y direction shown in FIG. 5(A) are each 2 mm, and thickness t3 of corner thin portion 3 with regard to the Z direction is 0.3 mm (which is 0.1 mm, however, for samples in which an overall thickness of electrode 2a is 0.2 mm and 0.3 mm). Table 3 below shows results of experiments in which it was determined whether or not peeling off of surface electrode 2a from insulated substrate 1 occurred when a thermal shock cycle test was conducted on insulated circuit board 100 of the present embodiment shown in FIG. 1, which had surface electrode 2a shown in FIG. 5 formed on one main surface of insulated substrate 1.

TABLE 3

| Thickness of surface electrode 2a | Whether electrode 2a was peeled off from insulated substrate 1 |
|---|---|
| 0.2 mm | ○ (Not peeled off) |
| 0.3 mm | ○ (Not peeled off) |
| 0.4 mm | ○ (Not peeled off) |
| 0.6 mm | ○ (Not peeled off) |
| 0.8 mm | ○ (Not peeled off) |
| 1.0 mm | ○ (Not peeled off) |
| 1.2 mm | ○ (Not peeled off) |
| 1.5 mm | ○ (Not peeled off) |
| 1.6 mm | x (Peeled off) |

From Table 3, in the case where corner thin portions 3 were provided, surface 2a was not peeled off even when the thickness (in the Z direction of a region other than corner thin portions 3) of surface electrode 2a was increased to 1.5 mm.

As described above, in the case where corner thin portions 3 or the like are not provided (as in FIG. 3), the peeling off occurs when the thickness of electrode 2 (surface electrode 2a and backside electrode 2b) reaches 0.6 mm, whereas in the case where corner thin portions 3 are provided in the corner portions (as in FIGS. 1 and 5), the peeling off does not occur even when the thickness (of the region other than corner thin portions 3) of electrode 2 is set to 1.5 mm. It is preferred for electrode 2 to be as thick as possible from the viewpoint of reducing electrical resistance and thermal resistance of electrode 2. It can thus be said that it is preferred in the present embodiment to provide corner thin portions 3 in the corner portions, and to set the thickness in the Z direction (of the region other than corner thin portions 3) of (at least one of) surface electrode 2a and backside electrode 2b to not less than 0.6 mm and not more than 1.5 mm.

That it is preferred to provide corner thin portions 3 in the corner portions can also be argued from data below. Data in Table 4 below shows a comparison of maximum values of thermal stress among surface electrode 2a not having any of corner thin portions 3 and peripheral thin portion 6 formed therein as in FIG. 3, surface electrode 2a having peripheral thin portion 6 formed therein as in FIG. 4, and surface electrode 2a having corner thin portions 3 formed therein as in FIG. 5. It is noted that the dimensions of corner thin portions 3 and the like of each electrode 2 are basically the same as the values described above in FIGS. 3 to 5, and the thickness (of a portion not having corner thin portions 3 and peripheral thin portion 6 formed therein) is 1.0 mm in each case. Table 4 shows maximum values of shear stress as the thermal stress, in terms of relative values with respect to a value of 1 of surface electrode 2a not having any of corner thin portions 3 and peripheral thin portion 6 formed therein as in FIG. 3. It is noted that these stress values were obtained by finite element analysis.

TABLE 4

|  | Ratio of maximum values of thermal stress |
|---|---|
| Without thin portion | 1 |
| With peripheral thin portion 6 | 0.68 |
| With corner thin portions 3 | 0.64 |

Figure 4:
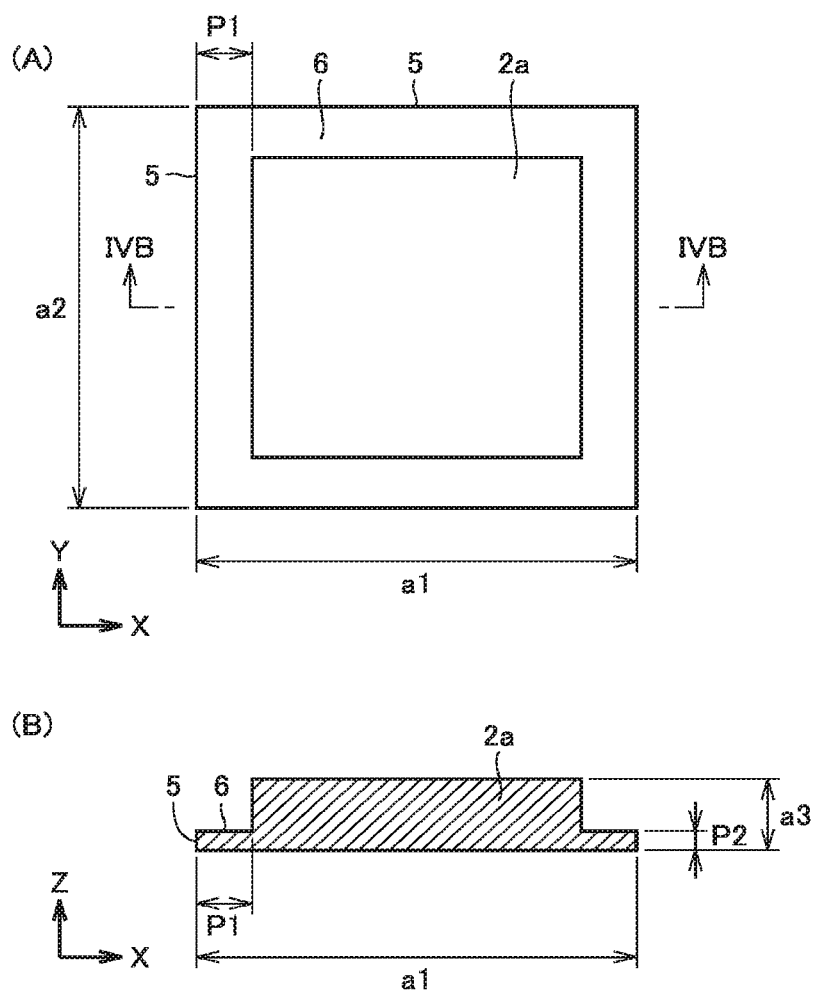
FIG. 4 shows a schematic plan view (A) of the surface electrode having a peripheral thin portion formed therein, and a schematic sectional view (B) of a portion taken along the line IVB-IVB of FIG. 4(A).

From Table 4, the shear stress maximum value in the case where peripheral thin portion 6 is provided as in FIG. 4 is 0.68 times, and the shear stress maximum value in the case where corner thin portions 3 are provided as in FIG. 5 is 0.64 times, with respect to the shear stress maximum value of electrode 2 without corner thin portions 3 or the like as in FIG. 3. That is, it can be seen that reducing the thickness of only the corner portions of electrode 2 leads to greatly reduced stress.

Next, variation in thermal resistance of electrode 2 due to the provision of corner thin portions 3 or the like will be described. Table 5 below shows relative values of thermal resistance of electrodes 2 of FIG. 4 (with peripheral thin portion 6) and FIG. 5 (with corner thin portions 3), with respect to a value of 1 of thermal resistance of electrode 2 without corner thin portions 3 or the like (without a thin portion) of FIG. 3. It is noted that the dimensions of corner thin portions 3 and the like of each electrode 2 are basically the same as the values described above in FIGS. 3 to 5, and the thickness (of a portion not having corner thin portions 3 and peripheral thin portion 6 formed therein) is 1.0 mm in each case. It is noted that these stress values were obtained by finite element analysis.

TABLE 5

|  | Thermal resistance |
|---|---|
| Without thin portion | 1 |
| With peripheral thin portion 6 | 1.087 |
| With corner thin portions 3 | 1.018 |

From Table 5, the thermal resistance of electrode 2 provided with peripheral thin portion 6 as in FIG. 4 increased by about 9%, whereas the thermal resistance of electrode 2 provided with corner thin portions 3 as in FIG. 5 only increased by about 2%, with respect to the thermal resistance of electrode 2 without corner thin portions 3 or the like as in FIG. 3. Therefore, reducing the thickness of only the corner portions of electrode 2 as in the present embodiment can lead to relaxation of the (thermal) stress of electrode 2 caused by heat generated by the power semiconductor element placed on electrode 2, while minimizing increase in thermal resistance of electrode 2 for the purpose of dissipating this generated heat. In other words, increase in both thermal stress and thermal resistance can be suppressed in the present embodiment.

Figure 6:
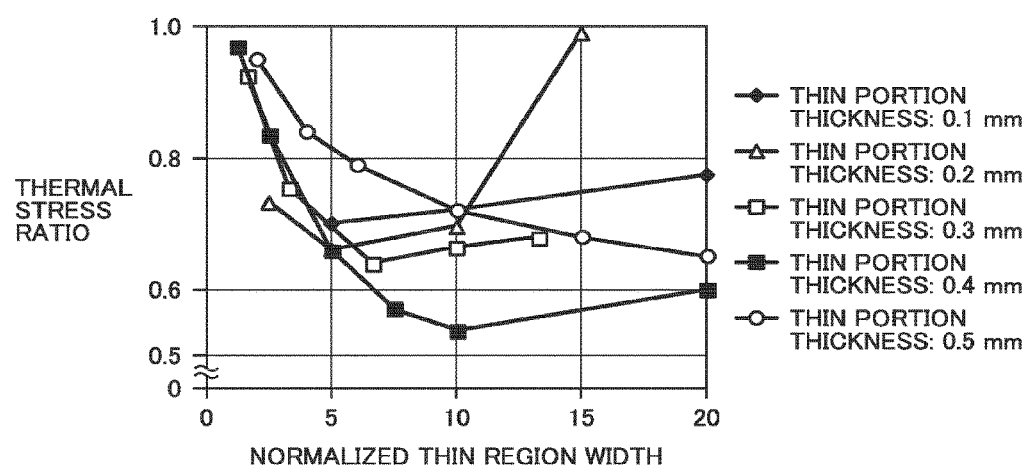
FIG. 6 is a graph showing a relationship between the size of a corner thin portion and a value of thermal stress to an electrode having the corner thin portion formed therein, with a varying thickness of the corner thin portion.

Next, optimal values of the thickness and size of corner thin portion 3 in the present embodiment will be described. Referring to FIG. 6, the horizontal axis of this graph represents a normalized value obtained by dividing the shortest width of corner thin portion 3 by the thickness of corner thin portion 3, and the vertical axis represents a relative value of normalized thermal stress during a thermal shock cycle test in each sample.

The shortest width of corner thin portion 3 as used herein means the shortest distance from one vertex 4 of electrode 2 included in corner thin portion 3 (serving as a starting point of corner thin portion 3) to a region other than corner thin portion 3 in this electrode 2. That is, referring to FIG. 1, for example, the shortest width of each of four corner thin portions 3 formed in surface electrode 2a here is a value T equal to t1 and t2. Referring to FIG. 2, the shortest width of each of four corner thin portions 3 formed in surface electrode 2b here is value T equal to t4 and t5.

The data in FIG. 6 was derived by finite element analysis for electrode 2 basically having dimensions equal to the values described in FIG. 5, and the thickness (of a portion not having corner thin portions 3 formed therein) is 1.0 mm in each case. The thickness of corner thin portions 3 is varied within a range of from 0.1 mm to 0.5 mm.

From FIG. 6, the values of thermal stress are generally at a minimum when the normalized shortest width of corner thin portion 3 on the horizontal axis is within a range of from not less than 5 to not more than 10. The thermal stress generally increases when this shortest width falls below 5, and also generally increases when this shortest width exceeds 10.

Thus, considering that the range of from not less than 5 to not more than 10 is an appropriate dimension of the shortest width of corner thin portion 3, within this range, when the thickness of corner thin portion 3 is 0.2 mm, 0.3 mm or 0.4 mm, the relative value of thermal stress is not more than 0.7. In contrast, within this range of from not less than 5 to not more than 10 of the normalized shortest width, when the thickness of corner thin portion 3 is 0.1 mm and 0.5 mm, the relative value of thermal stress may exceed 0.7.

It can therefore be said, from the viewpoint of reducing the thermal stress, that it is preferred for the thickness of corner thin portion 3 to be not less than 0.2 mm and not more than 0.4 mm, and for the normalized value obtained by dividing the shortest distance to the region other than corner thin portion 3 by the thickness to be not less than 5 and not more than 10. Stated another way, it is preferred that the shortest distance of corner thin portion 3, from one vertex 4 included in that corner thin portion 3 to a region other than corner thin portion 3 in this electrode 2 (at least one of surface electrode 2a and backside electrode 2b), be not less than five times and not more than ten times the thickness of corner thin portion 3. It is noted that the thickness of corner thin portion 3 is more preferably not less than 0.3 mm and not more than 0.4 mm. The value of thermal stress can thereby be maintained at a relatively low level, even when the normalized value on the horizontal axis of FIG. 6 falls outside the range of from not less than 5 to not more than 10.

It is noted that, from the graph of FIG. 6, when the thickness of corner thin portion 3 is 0.2 mm, the stress is at a minimum when the normalized value of the shortest width is 5, that is, when an absolute value of the shortest width is 1 mm, whereas when the thickness of corner thin portion 3 is 0.3 mm, the stress is at a minimum when the normalized value of the shortest width is 6.7, that is, when an absolute value of the shortest width is 2 mm. The reason that the shortest width of corner thin portion 3 at which the stress is at a minimum varies with the variation in thickness of corner thin portion 3 in this manner is because a maximum stress point (that is, a stress-concentrated portion) of electrode 2 shifts to a region away from vertex 4 as the shortest width of corner thin portion 3 increases.

Figure 7:
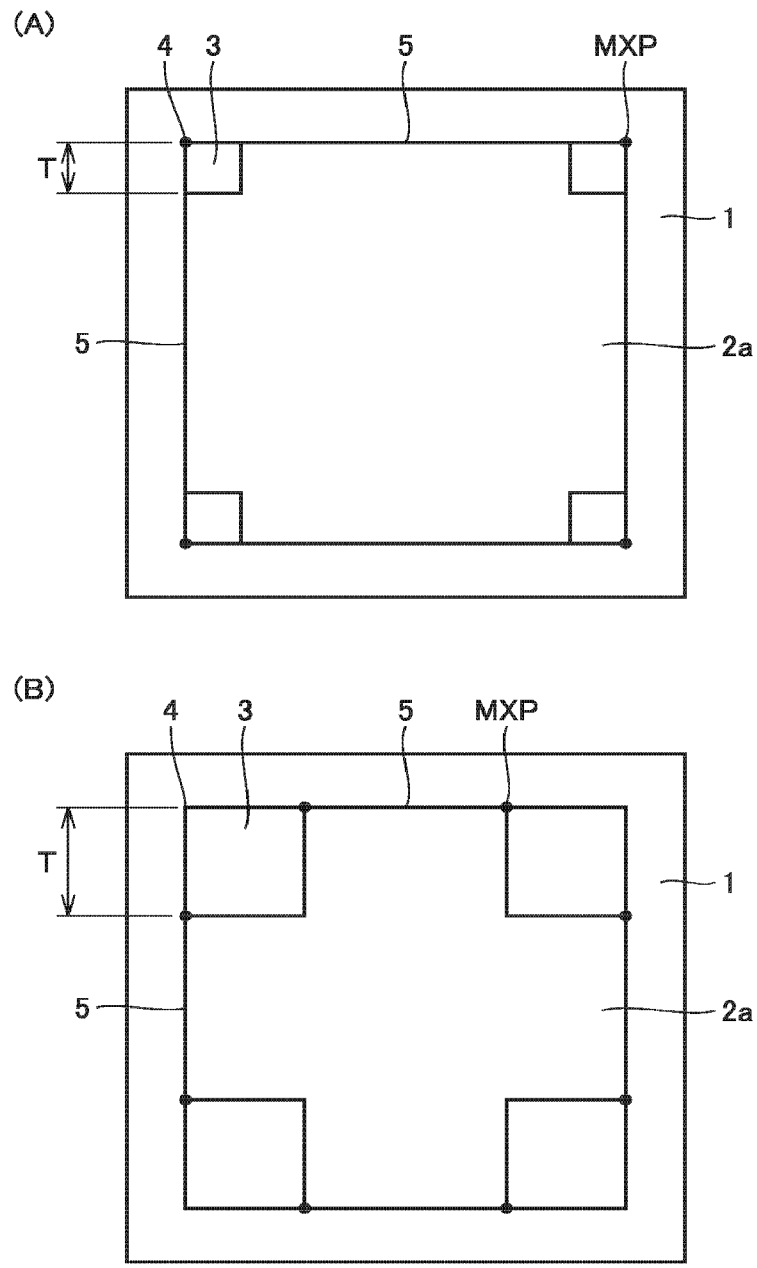
FIG. 7 shows a schematic plan view (A) showing the position of a maximum stress point of the electrode when the corner thin portion is relatively small, and a schematic plan view (B) showing the position of a maximum stress point of the electrode when the corner thin portion is relatively large.

Referring to FIG. 7(A), when a shortest width T of corner thin portion 3 is relatively small, a maximum stress point MXP is located at vertex 4 of surface electrode 2a. Referring to FIG. 7(B), in contrast, as shortest width T of corner thin portion 3 increases, maximum stress point MXP shifts away from vertex 4 to a position that matches a corner other than vertex 4 of corner thin portion 3. The peeling off of electrode 2 basically occurs with this maximum stress point MXP as a starting point.

Once the state of FIG. 7(B) is reached, increasing shortest width T of corner thin portion 3 further does not produce the stress reducing effect, but rather increases a maximum stress value. Thus, the stress reducing effect will not be enhanced as corner thin portion 3 is enlarged, and it is preferred to make shortest width T smaller than that in the state of FIG. 7(B). Shortest width T when this position of maximum stress point MXP shifts varies depending on the thickness of corner thin portion 3, and basically increases as the thickness of corner thin portion 3 increases. In view of the above, shortest width T of corner thin portion 3 at which the stress is at a minimum varies with the variation in thickness of corner thin portion 3, and the maximum stress value can be reduced by setting shortest width T to not less than five times and not more than ten times the thickness of corner thin portion 3.

Next, using FIGS. 8 to 11, modifications of the planar shape of corner thin portion 3 will be particularly described as modifications of the insulated circuit board of the present embodiment.

Figure 8:
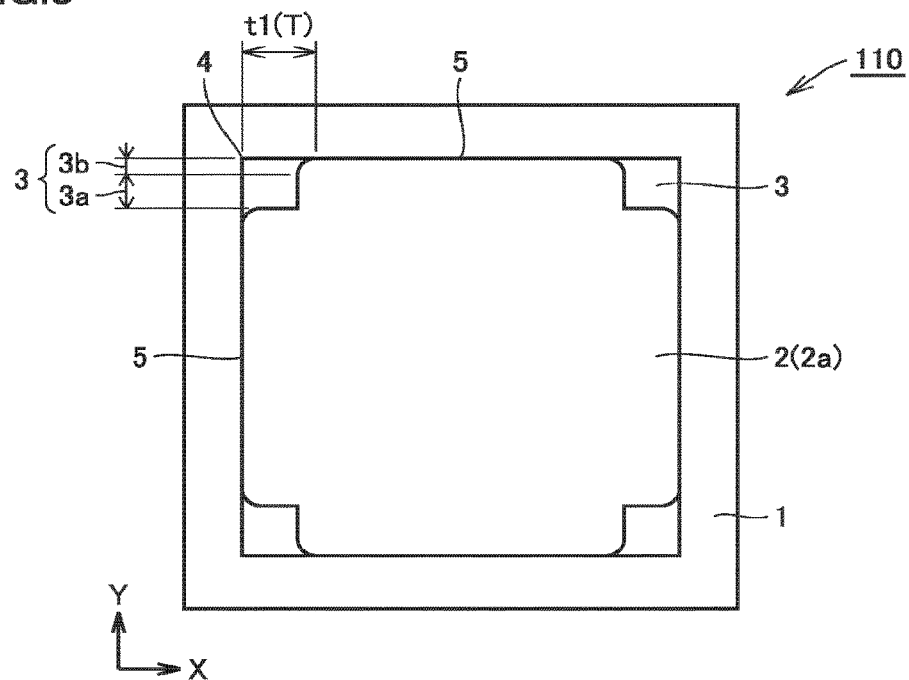
FIG. 8 is a schematic plan view showing the configuration of an insulated circuit board of a first modification of the first embodiment as seen from the side of the surface electrode.

Referring to FIG. 8, since an insulated circuit board 110 of a first modification of the present embodiment basically has a similar configuration to that of insulated circuit board 100 described above, the same numbers and the like indicate the same components and description thereof will not be repeated. Insulated circuit board 110 of FIG. 8, however, differs from insulated circuit board 100 described above in the planar shape of corner thin portion 3.

Specifically, corner thin portion 3 of electrode 2 (surface electrode 2a and backside electrode 2b) of insulated circuit board 110 generally has a substantially square shape in plan view, but the outer edge of corner thin portion 3 away from vertex 4 (not continuous with vertex 4) has linear outer edges 3a and curved outer edges 3b. Stated another way, this outer edge of corner thin portion 3 away from vertex 4 corresponds to the boundary between corner thin portion 3 and a thick region other than the corner thin portion in surface electrode 2a and the like. This is different from the planar shape of corner thin portion 3 of insulated circuit board 100, which has a square shape in plan view because the entire outer edge (boundary) of corner thin portion 3 away from vertex 4 is linear.

Linear outer edges 3a extend in the X direction and the Y direction substantially parallel to the outer edges extending from vertex 4 of this corner thin portion 3. In contrast, curved outer edges 3b are each formed so as to draw the shape of an arc of 90°, for example, and this curved outer edge 3b intersects and contacts outer edge 5 of the entire electrode 2 (at least one of surface electrode 2a and backside electrode 2b). That is, curved outer edge 3b is formed on an outer side of surface electrode 2a than linear outer edge 3a, and linear outer edge 3a is in a manner not to intersect outer edge 5 of the entire electrode 2.

Curved outer edge 3b extends in a direction away from vertex 4 of corner thin portion 3, such that the dimension of a portion of corner thin portion 3 along outer edge 5 (for example, dimension t1 in the X direction) is greater than when curved outer edge 3b is not formed and linear outer edge 3a is formed to reach outer edge 5. However, in the example of FIG. 8, too, the shortest distance (shortest width T) of corner thin portion 3 from vertex 4 to the region other than corner thin portion 3 is basically substantially equal to t1 of FIG. 8.

If the outer edge of corner thin portion 3 that corresponds to the boundary between corner thin portion 3 and the other thicker region intersects outer edge 5 of the entire electrode 2 at arc-shaped curved outer edge 3b, for example, as in FIG. 8, the stress concentration at an intersection of outer edge 5 and curved outer edge 3b can be more reliably suppressed. This is because, as was described in FIG. 7(B), maximum stress point MXP tends to occur at the intersection of outer edge 5 and curved outer edge 3b (particularly when shortest width T of corner thin portion 3 is relatively great).

Figure 9:
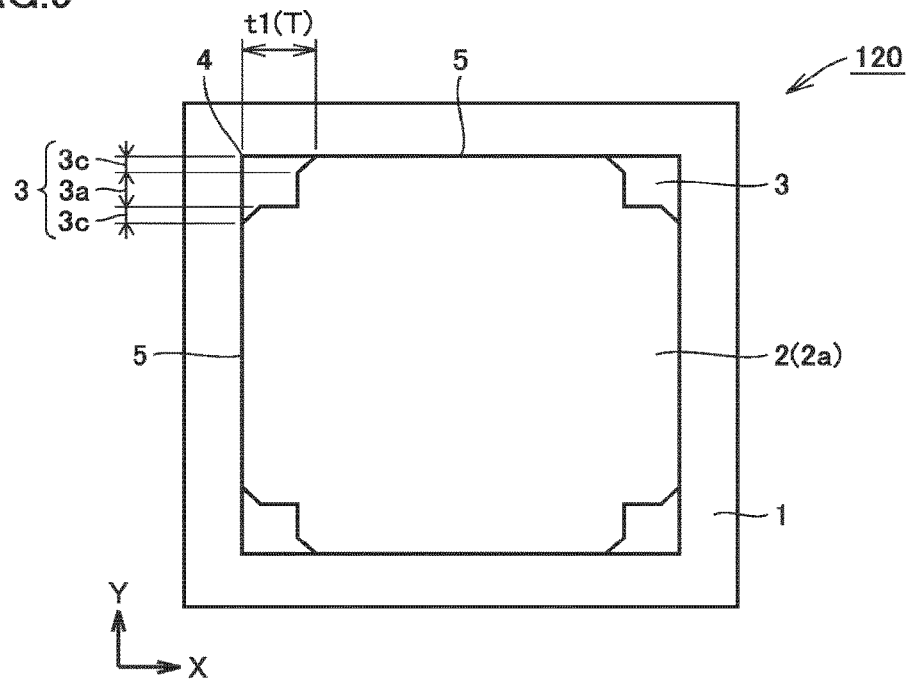
FIG. 9 is a schematic plan view showing the configuration of an insulated circuit board of a second modification of the first embodiment as seen from the side of the surface electrode.

Referring to FIG. 9, since an insulated circuit board 120 of a second modification of the present embodiment basically has a similar configuration to that of insulated circuit board 110 described above, the same numbers and the like indicate the same components as above and description thereof will not be repeated. Insulated circuit board 120 of FIG. 9, however, has oblique outer edges 3c instead of curved outer edges 3b of FIG. 8. In other words, in insulated circuit board 120 of FIG. 9, the outer edge of corner thin portion 3 (boundary between corner thin portion 3 and the other region) away from vertex 4 (not continuous with vertex 4) has linear outer edges 3a and oblique outer edges 3c.

Oblique outer edges 3c each have a linear shape inclined so as to have a certain angle (for example, 45°) with respect to the X direction or Y direction in which linear outer edge 3a extends. This oblique outer edge 3c intersects and contacts outer edge 5 of the entire electrode 2 (at least one of surface electrode 2a and backside electrode 2b). As with curved outer edge 3b, oblique outer edge 3c extends in a direction away from vertex 4 of corner thin portion 3, so as to increase the dimension of a portion of corner thin portion 3 along outer edge 5. However, in the example of FIG. 9, too, the shortest distance (shortest width T) of corner thin portion 3 from vertex 4 to the region other than corner thin portion 3 is basically substantially equal to t1 of FIG. 9.

Corner thin portion 3 of FIG. 9 can be regarded as a hexagonal shape because it has six sides forming its outer edge in plan view. In this manner, corner thin portion 3 is not limited to a square shape but may have any polygonal shape in plan view. In the case where oblique outer edge 3c is used instead of curved outer edge 3b as in FIG. 9, too, the stress concentration at an intersection of oblique outer edge 3c and outer edge 5 can be more reliably suppressed.

Figure 10:
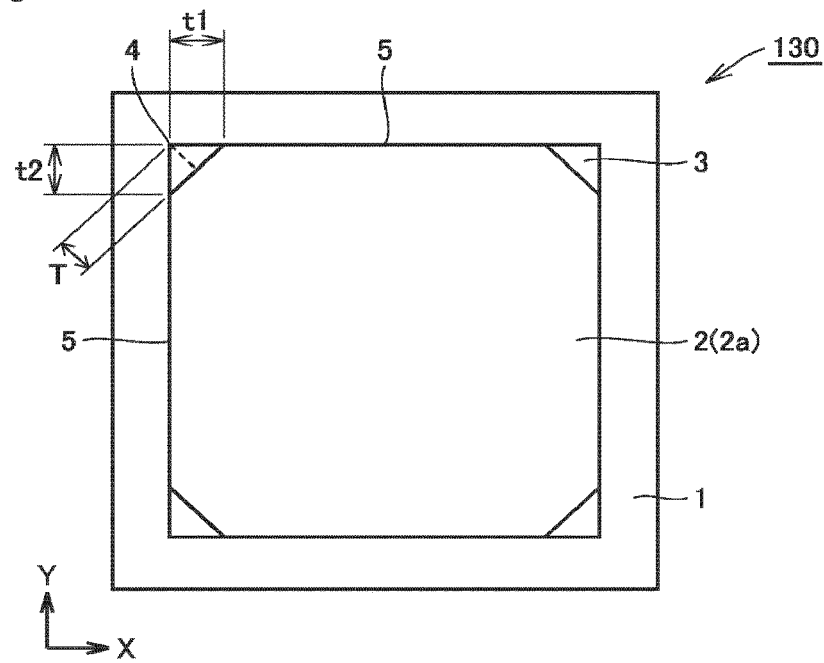
FIG. 10 is a schematic plan view showing the configuration of an insulated circuit board of a third modification of the first embodiment as seen from the side of the surface electrode.

Referring to FIG. 10, since an insulated circuit board 130 of a third modification of the present embodiment basically has a similar configuration to that of insulated circuit board 110 described above, the same numbers and the like indicate the same components as above and description thereof will not be repeated.

As in insulated circuit board 130, corner thin portion 3 may have a triangular shape in plan view, which is, for example, a right-angled isosceles triangle formed of two sides orthogonal to each other as portions of respective outer edges 5 in the X direction and the Y direction of electrode 2 (such as surface electrode 2a), and one side serving as the boundary between corner thin portion 3 and the other region and extending in a direction of 45°, for example, with respect to the X direction and the Y direction so as to connect the two sides.

When the above boundary forms an angle of 45° with respect to the X direction and the Y direction, dimension t1 and dimension t2 of corner thin portion 3 shown in FIG. 10 have substantially equal values. Further, in this example, shortest width T of corner thin portion 3 corresponds to the length of a normal (a dotted line portion in corner thin portion 3) connecting vertex 4 to a side facing vertex 4 (the above boundary between corner thin portion 3 and the other region).

Figure 11:
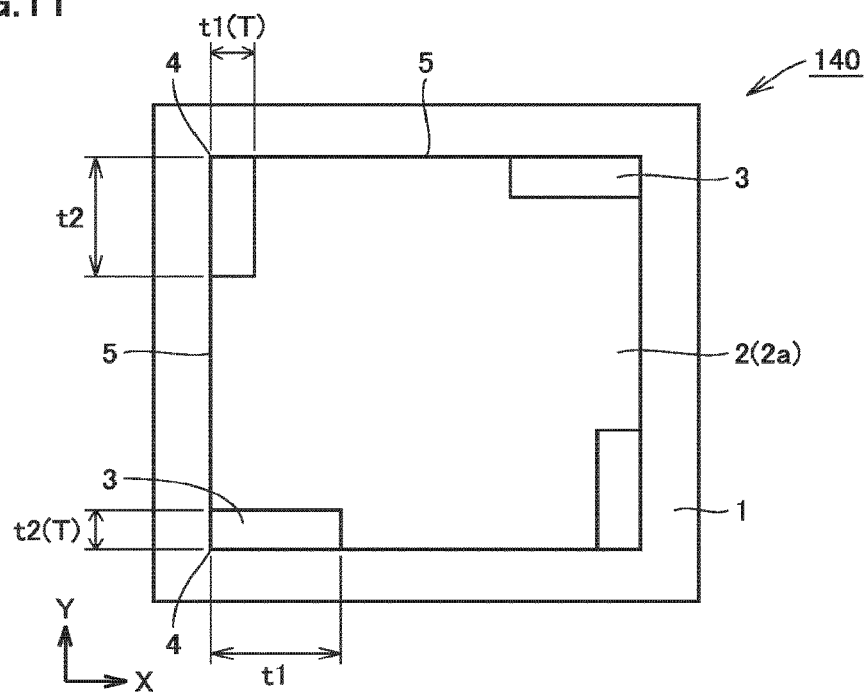
FIG. 11 is a schematic plan view showing the configuration of an insulated circuit board of a fourth modification of the first embodiment as seen from the side of the surface electrode.

Referring to FIG. 11, since an insulated circuit board 140 of a fourth modification of the present embodiment basically has a similar configuration to that of insulated circuit board 110 described above, the same numbers and the like indicate the same components as above and description thereof will not be repeated. In insulated circuit board 140 of FIG. 11, however, corner thin portion 3 has an oblong shape instead of a square shape in plan view. By way of example, FIG. 11 shows an arrangement in which a configuration having dimension t1 in the X direction longer than dimension t2 in the Y direction and a configuration having dimension t2 in the Y direction longer than dimension t1 in the X direction are alternately disposed with regard to a peripheral direction along outer edges 5, such an arrangement is not limiting. In this case, shortest width T of corner thin portion 3 is equal to the shorter one of dimension t1 in the X direction and dimension t2 in the Y direction.

Figure 12:
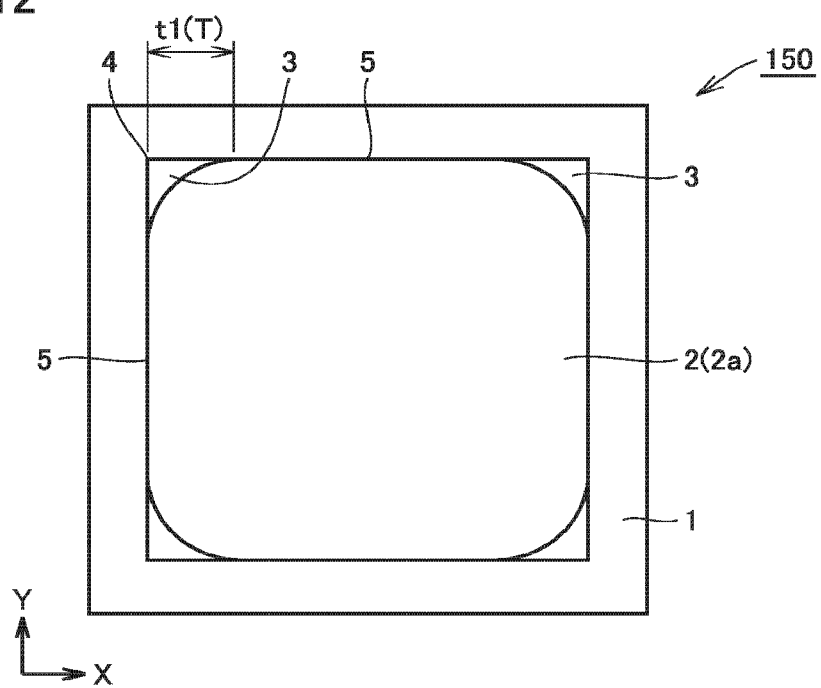
FIG. 12 is a schematic plan view showing the configuration of an insulated circuit board of a fifth modification of the first embodiment as seen from the side of the surface electrode.

Referring to FIG. 12, since an insulated circuit board 150 of a fifth modification of the present embodiment basically has a similar configuration to that of insulated circuit board 100 described above, the same numbers and the like indicate the same components as above and description thereof will not be repeated. In insulated circuit board 150 of FIG. 12, however, corner thin portion 3 has a planar shape surrounded by an outer edge formed of portions extending in the X direction and the Y direction from vertex 4, and a curved (arc-shaped) portion away from vertex 4 (not continuous with vertex 4). Processes (such as a cutting process) for forming corner thin portion 3 can thereby be facilitated as compared to the other modifications and the like, allowing for reduced manufacturing cost.

As illustrated in each of the above modifications, the planar shape of corner thin portion 3 is not limited to a square shape but may be any polygonal shape or a shape including a curve, and the function and effect of suppressing the increase in thermal stress and thermal resistance can be produced with such shapes as well.

It is noted that in an example in which triangular corner thin portion 3 as shown in FIG. 10 is formed, for example, it is preferred that the length of the normal from vertex 4 (shortest width T) be not less than 2 mm (within the range of from not less than 0.2 mm to not more than 0.4 mm of the thickness of corner thin portion 3), from the viewpoint of producing the effect of sufficiently reducing the stress.

Although the description has been given here mainly for surface electrode 2a in each of the above modifications of FIGS. 8 to 11, the same as that for surface electrode 2a basically applies to backside electrode 2b as well.

Second Embodiment

Figure 13:
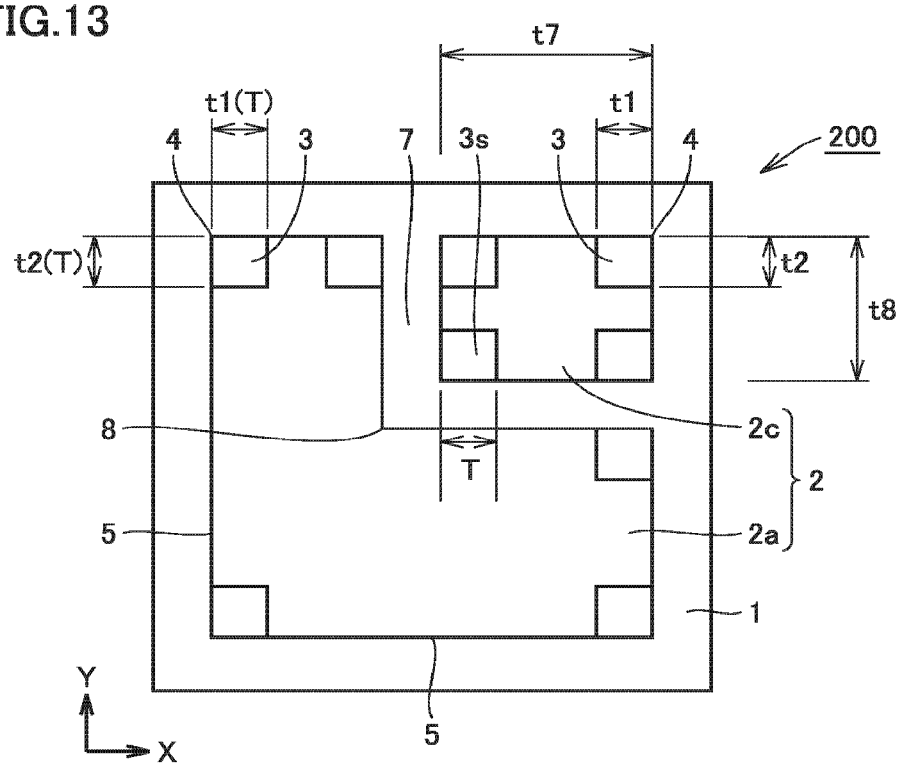
FIG. 13 is a schematic plan view showing the configuration of an insulated circuit board of a second embodiment as seen from the side of the surface electrode.

First, the configuration of an insulated circuit board 200 of the present embodiment is described using FIG. 13.

Referring to FIG. 13, since insulated circuit board 200 of the present embodiment basically has a similar configuration to that of insulated circuit board 100 described above, the same numbers and the like indicate the same components and description thereof will not be repeated. In insulated circuit board 200 of FIG. 13, however, the surface electrode of electrode 2 is divided into surface electrode 2a and a surface electrode 2c.

Surface electrode 2a and surface electrode 2c are in a manner that a single surface electrode 2a having a square shape in insulated circuit board 100 is divided into two parts by forming a dividing portion 7, which is bent in an L shape from a central portion of upper outer edge 5 in FIG. 1 to a central portion on the right side in FIG. 1, for example. Surface electrode 2a and surface electrode 2c are thus spaced from each other at dividing portion 7.

Surface electrode 2a has a shape extending continuously while being bent in an L shape from upper left and lower left regions to a lower right region in insulated substrate 1 of FIG. 13. In contrast, surface electrode 2c is arranged to have a rectangular shape (oblong shape) in an upper right region in insulated substrate 1 of FIG. 13. In this manner, in the present embodiment, the surface electrode is divided into a plurality of (for example, two) parts at a distance from each other on the upper main surface of insulated substrate 1. In insulated circuit board 200 with such a divided electrode pattern formed thereon, too, the function and effect of reducing the thermal stress while suppressing the increase in thermal resistance can be implemented by corner thin portion 3, as in insulated circuit board 100 of the first embodiment. It is noted that although the surface electrode is divided into two surface electrodes 2a and 2c in FIG. 13, this is not limiting, and the surface electrode may be divided into three or more parts.

Surface electrode 2a of FIG. 13 can be regarded as a hexagonal shape because it has six sides forming its outer edge in plan view. In this manner, surface electrode 2a is not limited to a square shape but may have any polygonal shape in plan view (for example, an octagonal shape may be employed). Surface electrode 2c has an oblong shape having a dimension t7 in the X direction longer than a dimension t8 in the Y direction. Surface electrode 2c may have an oblong shape in this manner.

Surface electrode 2a of FIG. 13 has six corner portions, of which five outwardly projecting corner portions (in the vicinity of vertexes 4) each have corner thin portion 3 formed therein. These corner portions are right-angled as in the first embodiment, and each corner thin portion 3 of FIG. 13 has a square shape in plan view. Thus, t1 and t2 of FIG. 13 have substantially equal values, and shortest width T of corner thin portion 3 is equal to t1. In contrast, surface electrode 2a has one outwardly recessed corner portion (recessed vertex 8) formed therein, and corner thin portion 3 is not formed in the vicinity of this recessed vertex 8.

In the corner portion including usual outwardly projecting vertex 4, it is preferred to form corner thin portion 3 from the viewpoint of suppressing the increase in stress caused by heat generated by the power semiconductor element placed on this electrode. In the corner portion including outwardly recessed vertex 8, however, it is not required to provide corner thin portion 3 because stress concentration is less likely to occur at this corner portion.

However, particularly in a corner portion of surface electrode 2c adjacent to surface electrode 2a (an outwardly projecting corner portion in the lower left of surface electrode 2c in FIG. 13) facing the corner portion including recessed vertex 8, it is preferred to form a corner thin portion 3s thinner than corner thin portions 3 formed in the other corner portions of surface electrode 2c and in the corner portions of surface electrode 2a. Alternatively, it is preferred to cause the aforementioned corner thin portion 3s to be formed with a width (shortest width T) greater than shortest width T of the other corner thin portions 3. This is because the corner portion including corner thin portion 3s is located in a central portion of insulated substrate 1 in plan view, and this location is greatly affected by the stress from backside electrode 2b, and is therefore subjected to higher thermal stress than the corner portions located on the outer side of insulated substrate 1 in plan view. By forming corner thin portion 3s to be thinner, or larger (greater), than corner thin portions 3 as described above, the effect of suppressing the stress concentration can be enhanced.

Referring to FIGS. 14(A), (B) and (C), however, as a modification of the present embodiment, the whole of divided surface electrode 2c may be formed to be thinner than the region of surface electrode 2a other than corner thin portions 3. That is, surface electrode 2c in FIG. 14 is formed to have a thickness t9 which is equal to or less than thickness t3 of corner thin portions 3.

This modification is applicable to situations where dissipation of a large amount of heat is not required in surface electrode 2c, such as when a power semiconductor element is not joined to the surface of surface electrode 2c, and only a bonding wire is connected to the surface of surface electrode 2c.

Since an insulated circuit board 210 of the modification of the present embodiment shown in FIG. 14 basically has a similar configuration to that of insulated circuit board 200 described above, the same numbers and the like indicate the same components as above and description thereof will not be repeated.

Although the description has been given here mainly for surface electrode 2a in the above present embodiment, the same as that for surface electrode 2a basically applies to backside electrode 2b as well. That is, the backside electrode may be divided into a plurality of (for example, two) parts at a distance from each other on the lower main surface of insulated substrate 1. Although the present embodiment has only described the application example of corner thin portion 3 having a square shape, corner thin portion 3 in each of the modifications shown in FIGS. 8 to 11 of the first embodiment can be applied to the present embodiment.

Third Embodiment

First, the configuration of an insulated circuit board 300 of the present embodiment is described using FIG. 15.

Referring to FIGS. 15(A) and (B), since insulated circuit board 300 of the present embodiment basically has a similar configuration to that of insulated circuit board 100 described above, the same numbers and the like indicate the same components and description thereof will not be repeated. In insulated circuit board 300 of FIG. 15, however, surface electrode 2a has a laminated structure of a surface first layer electrode 2a1 (first layer) and a surface second layer electrode 2a2 (second layer). Further, in insulated circuit board 300, backside electrode 2b has a laminated structure of a backside first layer electrode 2b1 (first layer) and a backside second layer electrode 2b2 (second layer). In other words, in the present embodiment, (at least one of) surface electrode 2a and backside electrode 2b has a structure having a plurality of laminated layers (made of different materials).

Surface first layer electrode 2a1 is formed so as to cover the upper main surface of insulated substrate 1, and surface second layer electrode 2a2 is formed so as to cover the surface of surface first layer electrode 2a1. Similarly, backside first layer electrode 2*b*1 is formed so as to cover the lower main surface of insulated substrate 1, and backside second layer electrode 2*b*2 is formed so as to cover the surface of backside first layer electrode 2*b*1. Surface first layer electrode 2*a*1 and backside first layer electrode 2*b*1 are made of aluminum, and surface second layer electrode 2*a*2 and backside second layer electrode 2*b*2 are made of copper.

Each of surface second layer electrode 2*a*2 and backside second layer electrode 2*b*2 has corner thin portions 3 formed in its corner portions as in the other embodiments. As shown in FIG. 15(B), for example, this corner thin portion 3 may be in a manner that surface second layer electrode 2*a*2 and backside second layer electrode 2*b*2 are completely removed to expose surface second layer electrode 2*a*2 and backside second layer electrode 2*b*2 therebelow. Alternatively, corner thin portion 3 may be in a manner that a partial thickness of each of surface second layer electrode 2*a*2 and backside second layer electrode 2*b*2 is removed so as to partially leave these electrodes.

Although each of surface electrode 2*a* and backside electrode 2*b* has a laminated structure of two layers in FIG. 15, this is not limiting, and they each may have a laminated structure of three or more layers.

In the present embodiment, the aluminum of surface first layer electrode 2*a*1 and backside first layer electrode 2*b*1, for example, undergoes plastic deformation under low stress. The peeling off of electrode 2 (surface electrode 2*a* and backside electrode 2*b*) from insulated substrate 1 is thereby suppressed as compared to electrode 2 formed of a single layer made of copper in the first embodiment.

However, since aluminum has lower thermal conductivity than copper, a desired thermal resistance may not be implemented if electrode 2 is formed of a single layer of aluminum. Thus, by employing the laminated structure of an aluminum layer and a copper layer as in the present embodiment, both the effect of reducing the stress to suppress the peeling off of electrode 2 and the effect of reducing the thermal resistance can be produced.

It is noted that the above description has been given with reference to first layer electrodes 2*a*1, 2*b*1 made of aluminum and second layer electrodes 2*a*2, 2*b*2 made of copper. However, this combination is not limiting, and any material configuration that facilitates the deformation of the first layer electrodes may be employed in consideration of the yield stress and thermal expansion coefficient of the material for each of these layers.

Although the present embodiment has only described the application example of corner thin portion 3 having a square shape, corner thin portion 3 in each of the modifications shown in FIGS. 8 to 11 of the first embodiment can be applied to the present embodiment, or the aforementioned laminated structure can be applied to the plurality of divided surface electrodes 2*a* and 2*c* as in the second embodiment.

Fourth Embodiment

Figure 16:
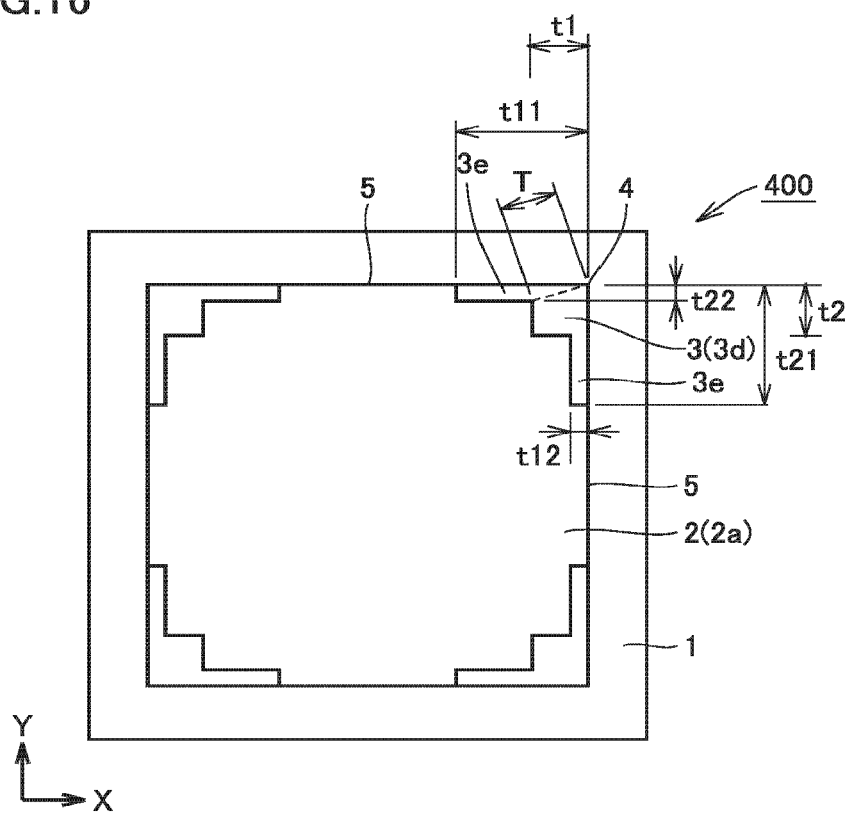
FIG. 16 is a schematic plan view showing the configuration of an insulated circuit board of a fourth embodiment as seen from the side of the surface electrode.

First, the configuration of an insulated circuit board 400 of the present embodiment is described using FIG. 16.

Referring to FIG. 16, since insulated circuit board 400 of the present embodiment basically has a similar configuration to that of insulated circuit board 100 described above, the same numbers and the like indicate the same components and description thereof will not be repeated. In insulated circuit board 400 of FIG. 15, however, corner thin portion 3 having a square shape, for example, includes extensions extending along outer edges 5 of electrode 2, at an outer edge portion along and in the vicinity of outer edges 5. These extensions extend for a length longer than a region other than this outer edge portion in the X direction and the Y direction in plan view. That is, corner thin portion 3 of FIG. 15 is configured to have a square-shaped thin portion 3*d* having a square shape as with corner thin portion 3 of FIG. 1, and outer-edge-side thin portions 3*e* (extensions) extending outward along outer edges 5 from that square-shaped thin portion 3*d*, for example.

Outer-edge-side thin portions 3*e* extend in both the X direction and the Y direction from vertex 4 of each corner thin portion 3. Specifically, corner thin portion 3 located in the upper right of FIG. 16, for example, has outer-edge-side thin portion 3*e* extending in the X direction from vertex 4 to the position of a dimension t11 with regard to the X direction and having a width t22 with regard to the Y direction, and outer-edge-side thin portion 3*e* extending in the Y direction from vertex 4 to the position of a dimension t21 with regard to the Y direction and having a width t12 with regard to the X direction. Corner thin portion 3 also has, in the vicinity of vertex 4, square-shaped thin portion 3*d* similar to corner thin portion 3 of the first embodiment and the like. Here, the aforementioned dimensions t11 and t21 are greater than dimensions t1 and t2 of square-shaped thin portion 3*d*, and the aforementioned dimensions t12 and t22 are smaller than dimensions t1 and t2 of square-shaped thin portion 3*d*.

Shortest width T of corner thin portion 3 of the present embodiment is a distance from vertex 4 to a point of the outer edge of corner thin portion 3 that is located at the boundary between square-shaped thin portion 3*d* and outer-edge-side thin portion 3*e*.

In corner thin portion 3 of the present embodiment having outer-edge-side thin portions 3*e* as extensions, too, each outer-edge-side thin portion 3*e* is at least formed only along a portion of outer edge 5 from vertex 4, and does not have a length along the entire outer edge 5 (the length of outer-edge-side thin portion 3*e* along outer edge 5 is less than half the length of outer edge 5, so that outer-edge-side thin portions 3*e* adjacent to each other are not in contact with each other). Thus, corner thin portion 3 of the present embodiment including outer-edge-side thin portions 3*e* is entirely formed in the corner portion of electrode 2.

The present embodiment is useful for situations where it is difficult to sufficiently increase shortest width T of corner thin portion 3 due to design constraints of an electrode pattern, such as when it is necessary to place a power semiconductor element, or to join a terminal, in the vicinity of square-shaped thin portion 3*d*. That is, providing outer-edge-side thin portions 3*e* can increase shortest width T of corner thin portion 3 as much as possible (as compared to the case where outer-edge-side thin portions 3*e* do not exist). Moreover, since outer-edge-side thin portions 3*e* are formed along outer edges 5 of electrode 2 to have small widths t12 and t22 (smaller than dimensions t1 and t2 of square-shaped thin portion 3*d*), the likelihood that there will be design constraints of an electrode pattern by outer-edge-side thin portions 3*e* can be reduced. Accordingly, the effect of sufficiently reducing the thermal stress by corner thin portion 3 can be produced in the present embodiment as well.

Although the description has been given here mainly for surface electrode 2*a* in the above present embodiment, the same as that for surface electrode 2*a* basically applies to backside electrode 2*b* as well. Moreover, corner thin portion 3 of the present embodiment can be applied to the plurality of divided surface electrodes 2*a* and 2*c* as in the second embodiment, and to surface electrode 2*a* having the plurality of laminated layers as in the third embodiment.

Fifth Embodiment

Application examples of the insulated circuit boards of the embodiments described above to an actual power module will be described using FIGS. 17 to 19.

Figure 17:
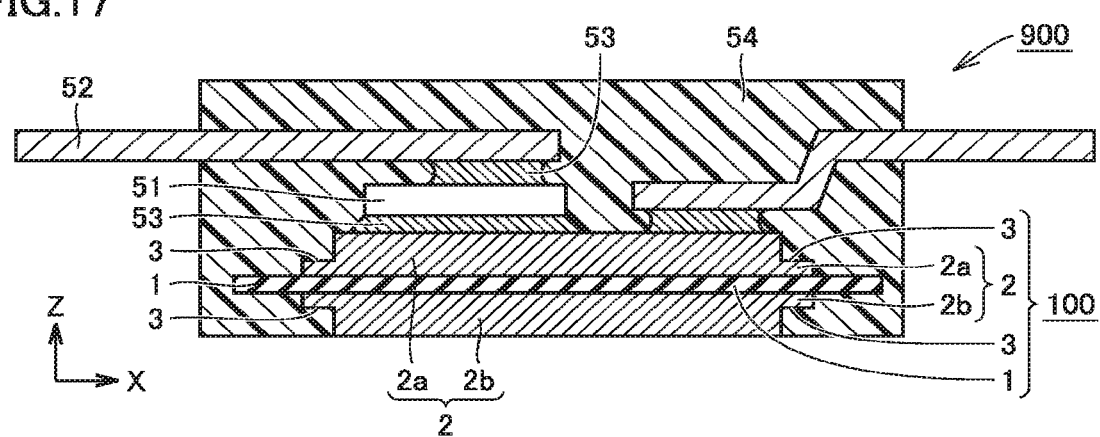
FIG. 17 is a schematic sectional view showing the configuration of a power module of a fifth embodiment.

Referring to FIG. 17, an IGBT module 900 as a power module of the present embodiment mainly has insulated circuit board 100 of the first embodiment, for example, power semiconductor element 51, a wiring member 52, a solder joint layer 53, and an epoxy resin 54.

Power semiconductor element 51 is a silicon semiconductor chip having an IGBT (Insulated Gate Bipolar Transistor) implemented thereon to constitute an integrated circuit. Instead of the chip having an IGBT implemented thereon, a chip having a FWD (Free Wheeling Diode) implemented thereon may be mounted as power semiconductor element 51. Power semiconductor element 51 is placed on the surface of surface electrode 2*a* of insulated circuit board 100 by being joined to the surface by solder joint layer 53.

It is more preferred, however, that power semiconductor element 51 be formed of, instead of the silicon semiconductor chip, a chip of a wide band gap semiconductor which is one from the group consisting of silicon carbide, a gallium nitride-based material, and diamond. A wide band gap semiconductor can operate at a higher temperature than silicon, and is thus of practical use when applied as a chip constituting power semiconductor element 51 that generates a particularly high amount of heat.

Wiring member 52 is a conductive member mediating input/output of electrical signals between power semiconductor element 51 and the outside of IGBT module 900. Wiring member 52 is made of copper, for example. Wiring member 52 may be joined to the surface of power semiconductor element 51 by solder joint layer 53, or may be joined to the surface of surface electrode 2*a* of insulated circuit board 100 by solder joint layer 53.

Insulated circuit board 100, (the whole of) the surface and side surfaces of power semiconductor element 51, and (a portion of) the surface of wiring member 52 are sealed with resin by epoxy resin 54, to thereby constitute IGBT module 900. IGBT module 900 is in a manner, as just described, that insulated circuit board 100 in which power semiconductor element 51 has been implemented and wired is sealed, and a wiring terminal can be drawn outside from wiring member 52. It is noted that the sealing may be done with gel instead of epoxy resin 54.

As the sealing method using epoxy resin 54, a commonly known potting molding method, transfer molding method or the like can be used. By sealing power semiconductor element 51 and the like with resin, environmental stress resistance and insulation properties can be enhanced, and damage to the joints at the upper and lower surfaces of power semiconductor element 51 caused by repeatedly applied thermal stress can be suppressed, thereby improving the operational reliability of power semiconductor element 51.

It is noted that wiring member 52 is actually connected by a bonding wire to a control terminal and the like formed on the surface of power semiconductor element 51, for example, which is not illustrated in FIG. 17.

Figure 18:
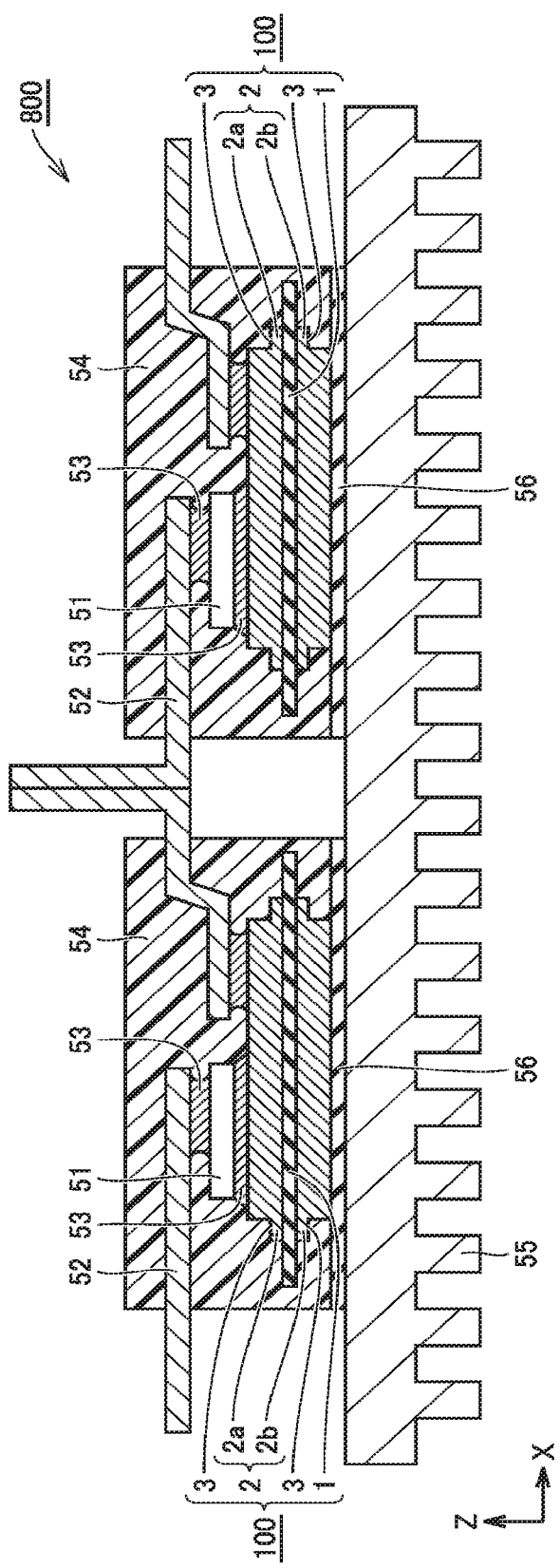
FIG. 18 is a schematic sectional view showing the configuration of a power unit of the fifth embodiment including the power module of FIG. 17.

Referring to FIG. 18, in a power unit 800 of the present embodiment, IGBT module 900 of FIG. 17 is placed on the surface of a heat sink 55 by being connected to the surface by a grease 56. Specifically, in FIG. 18, two IGBT modules 900 are connected to the upper surface of one heat sink 55 by grease 56 at a distance from each other. Wiring member 52 of one of two IGBT modules 900 and wiring member 52 of the other IGBT module 900 are electrically connected to each other.

Three-phase inverter equipment can be configured by forming three U-, V-, and W-phases, each phase being a system in which a plurality of (for example, two) IGBT modules 900 are connected to heat sink 55 by grease 56 to connect a p terminal and an n terminal to each other as in FIG. 18.

This three-phase inverter equipment is used for a power converter mounted on a railroad vehicle, a power converter mounted on a hybrid car, or the like. This three-phase inverter equipment is exposed to a thermal shock cycle due to heat generated by power semiconductor element 51 and temperature variation resulting from environmental conditions. Therefore, insulated circuit board 100 used in IGBT module 900 is also required to have reliability with respect to a thermal shock cycle. If an electrode of insulated circuit board 100 is peeled off by a thermal shock cycle, for example, partial discharge occurs at the peeled portion, causing a malfunction or failure of the power converter.

Thus, by applying insulated circuit board 100 of the present embodiment to IGBT module 900, the thermal stress can be reduced, thereby realizing IGBT module 900, that is, a power converter, having high resistance to a thermal shock cycle.

Although the application example of insulated circuit board 100 of the first embodiment has been described above, the insulated circuit boards of the modifications or other embodiments described above may be applied to IGBT module 900.

Sixth Embodiment

Figure 19:
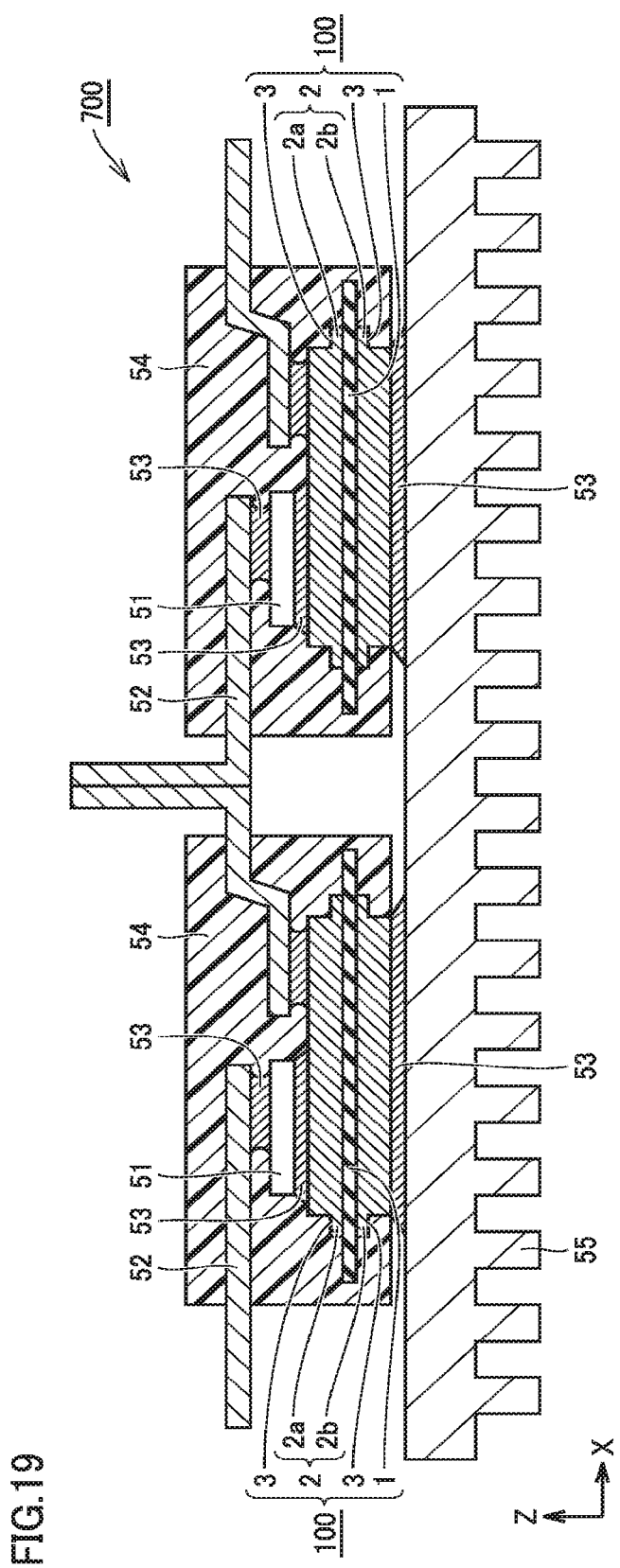
FIG. 19 is a schematic sectional view showing the configuration of a power unit of a sixth embodiment including the power module of FIG. 17.

First, the configuration of a power unit 700 of the present embodiment is described using FIG. 19.

Referring to FIG. 19, since power unit 700 of the present embodiment basically has a similar configuration to that of power unit 800 of the fifth embodiment, the same numbers and the like indicate the same components and description thereof will not be repeated. In power unit 700 of FIG. 19, however, the connection between IGBT module 900 and heat sink 55 is established by solder joint layer 53 instead of grease 56.

Since solder has higher thermal conductivity than grease 56, thermal resistance between IGBT module 900 and heat sink 55 can thereby be reduced. As a result, the size of IGBT module 900 can be further reduced.

In the case where IGBT module 900 and heat sink 55 are joined to each other by solder joint layer 53, however, the thermal stress applied to insulated circuit board 100 during the thermal shock cycle increases as compared to the case where they are joined by grease 56. It is thus required to greatly reduce the thermal stress applied to insulated circuit board 100. On the other hand, it is also required not to hinder the reduction in thermal resistance, which is a motive to join IGBT module 900 and heat sink 55 by solder joint layer 53.

Since insulated circuit board 100 used in IGBT module 900 in the present embodiment can reduce the thermal stress while suppressing the increase in thermal resistance owing to the formation of corner thin portions 3, the function and effect of suppressing the increase in thermal resistance and thermal stress can be produced for the entire power unit 700.

Although the application example of insulated circuit board 100 of the first embodiment has been described above, the insulated circuit boards of the modifications or other embodiments described above may be applied to IGBT module 900.

Seventh Embodiment

Figure 20:
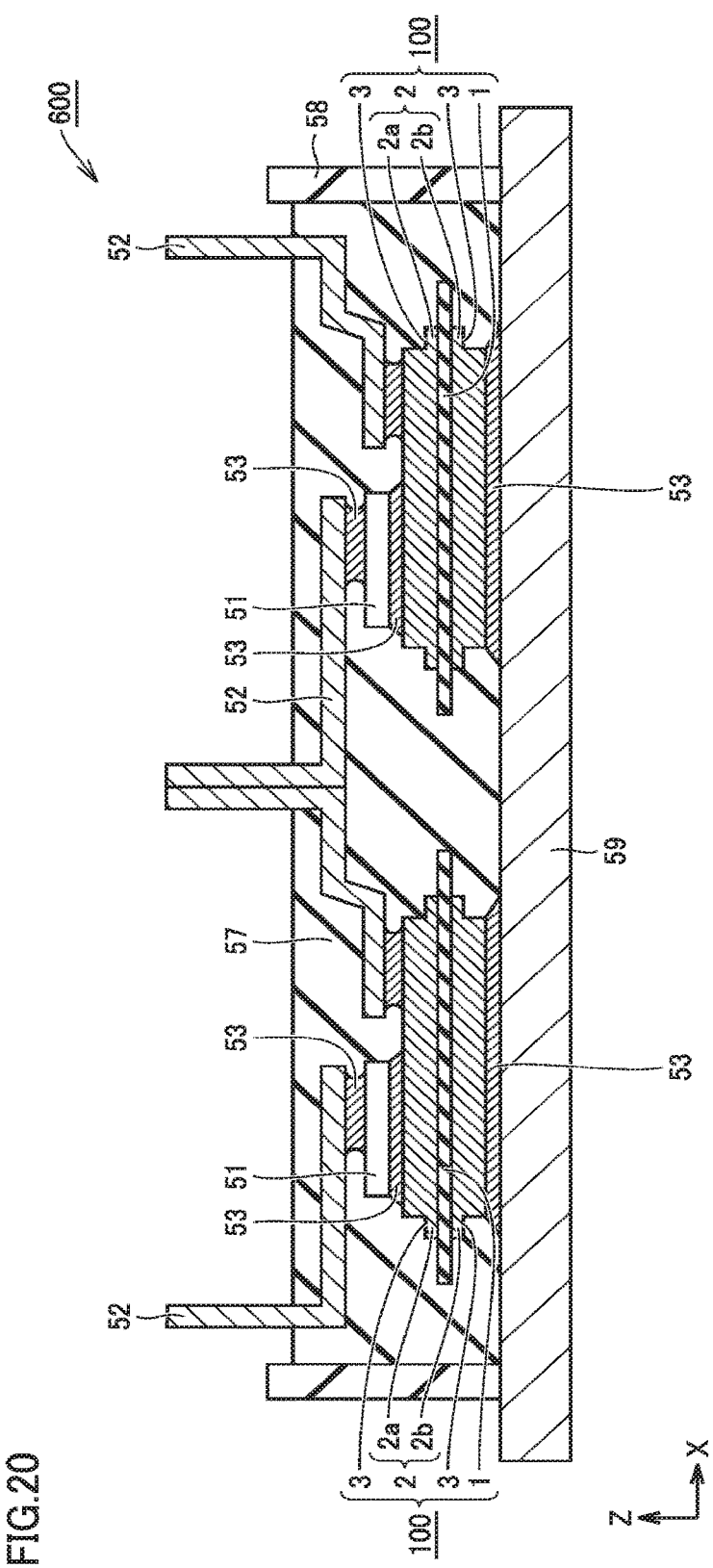
FIG. 20 is a schematic sectional view showing the configuration of a power unit of a seventh embodiment.

Referring to FIG. 20, since a power unit 600 of the present embodiment basically has a similar configuration to that of power unit 700 of the sixth embodiment, the same numbers and the like indicate the same components and description thereof will not be repeated. In power unit 600 of FIG. 20, however, insulated circuit board 100 is sealed with a gel 57 instead of epoxy resin 54, and this gel 57 is housed in a case 58. In addition, power unit 600 of FIG. 20 has a heat sink base plate 59 arranged therein, instead of heat sink 55. Heat sink base plate 59 is made of the same material as that for heat sink 55, but is not provided with fins for heat dissipation, and has the shape of a flat plate. It is noted that power unit 600 of FIG. 20 uses solder joint layer 53 as a heat dissipating member connected to the IGBT module by solder joint layer 53, as with power unit 700 of FIG. 19. Wiring member 52 may be bent as shown in FIG. 20, or may extend linearly as in FIGS. 18 and 19.

In FIG. 20, solder joint layer 53 is not attached to corner thin portions 3 of backside electrode 2b, but is only supplied to the lowermost surface of backside electrode 2b other than corner thin portions 3. As a result, even when thermal stress is applied to insulated circuit board 100 during a thermal shock cycle, concentration of this thermal stress in the corner portions (such as corner thin portions 3) of insulated circuit board 100 can be suppressed. If solder joint layer 53 is attached to corner thin portions 3 of backside electrode 2b (if a region between the surfaces of corner thin portions 3 and the surface of heat sink base plate 59 is filled with solder joint layer 53), cracks caused by the thermal stress can be suppressed to increase the life of solder joint layer 53 under the thermal shock cycle. This is because the thickness of solder joint layer 53 in contact with corner thin portions 3 increases, so that an amount of shear strain of this solder joint layer 53 can be reduced.

It should be understood that the embodiments disclosed herein are illustrative and non-restrictive in every respect. The scope of the present invention is defined by the claims, not by the description above, and is intended to include any modification within the meaning and scope equivalent to the terms of the claims.

REFERENCE SIGNS LIST

1 insulated substrate; 2 electrode; 2a surface electrode; 2a1 surface first layer electrode; 2a2 surface second layer electrode; 2b backside electrode; 2b1 backside first layer electrode; 2b2 backside second layer electrode; 3, 3s corner thin portion; 3d square-shaped thin portion; 3e outer-edge-side thin portion; 4 vertex; 5 outer edge; 6 peripheral thin portion; 7 dividing portion; 8 recessed vertex; 51 power semiconductor element; 52 wiring member; 53 solder joint layer; 54 epoxy resin; 55 heat sink; 56 grease; 57 gel; 58 case; 59 heat sink base plate; 100, 110, 120, 130, 140, 150, 200, 201, 300, 400 insulated circuit board; 600, 700, 800 power unit; 900 IGBT module.

The invention claimed is:
1. An insulated circuit board comprising:
   an insulated substrate;
   a first electrode formed on one main surface of the insulated substrate and having a polygonal shape in plan view; and
   a second electrode formed on the other main surface opposite to the one main surface of the insulated substrate and having a polygonal shape in plan view,
   a thin portion being formed in a corner portion, the corner portion being a region occupying, with regard to directions along outer edges from a vertex of at least one of the first and second electrodes in plan view, a portion of a length of the outer edges, so that the thin portion occupies only a portion of an entire length of the outer edges, the thin portion having a thickness smaller than a thickness of a region of the at least one of the first and second electrodes other than the thin portion,
   the thin portion in the at least one of the first and second electrodes having a planar shape surrounded by first and second sides orthogonal to each other as portions of the outer edges from the vertex, and a curved portion away from the vertex of the first and second sides.

2. The insulated circuit board according to claim 1, wherein
   the thin portion has a planar shape including the vertex among a plurality of vertexes of the at least one of the first and second electrodes, and
   a shortest distance of the thin portion, from the vertex included in the thin portion to the region other than the thin portion in the at least one of the first and second electrodes, is not less than five times and not more than ten times the thickness of the thin portion.

3. The insulated circuit board according to claim 1, wherein
   at least one of the first and second electrodes has a thickness of not less than 0.6 mm and not more than 1.5 mm.

4. The insulated circuit board according to claim 1, wherein
   the thin portion has a thickness of not less than 0.2 mm and not more than 0.4 mm.

5. The insulated circuit board according to claim 1, wherein
   at least one of the first and second electrodes is divided into a plurality of parts at a distance from each other on the one main surface or the other main surface.

6. The insulated circuit board according to claim 1, wherein
   at least one of the first and second electrodes includes a first layer formed so as to cover the one main surface or the other main surface, and a second layer formed so as to cover a surface of the first layer.

7. The insulated circuit board according to claim 1, wherein
   the thin portion of the at least one of the first and second electrodes includes extensions extending along the outer edges of the at least one of the first and second electrodes, at an outer edge portion along the outer edges.

8. A power module comprising:
   the insulated circuit board according to claim 1; and
   a power semiconductor element placed on a surface of the insulated circuit board.

9. The power module according to claim 8, wherein the power semiconductor element is made of a wide band gap semiconductor.

10. An insulated circuit board comprising:
    an insulated substrate;

a first electrode formed on one main surface of the insulated substrate and having a polygonal shape in plan view; and a second electrode formed on the other main surface opposite to the one main surface of the insulated substrate and having a polygonal shape in plan view, a thin portion being formed in a corner portion, the corner portion being a region occupying, with regard to directions along outer edges from a vertex of at least one of the first and second electrodes in plan view, a portion of a length of the outer edges, so that the thin portion occupies only a portion of an entire length of the outer edges, the thin portion having a thickness smaller than a thickness of a region of the at least one of the first and second electrodes other than the thin portion, the thin portion in the at least one of the first and second electrodes having a triangular shape in plan view surrounded by first and second sides orthogonal to each other as portions of the outer edges from the vertex, and a third side extending in a direction inclined with respect to the first and second sides so as to connect the vertex of the first and second sides to an opposite end portion.

11. The insulated circuit board according to claim 10, wherein the thin portion has a planar shape including the vertex among a plurality of vertexes of the at least one of the first and second electrodes, and a shortest distance of the thin portion, from the vertex included in the thin portion to the region other than the thin portion in the at least one of the first and second electrodes, is not less than five times and not more than ten times the thickness of the thin portion.

12. The insulated circuit board according to claim 10, wherein at least one of the first and second electrodes has a thickness of not less than 0.6 mm and not more than 1.5 mm.

13. The insulated circuit board according to claim 10, wherein the thin portion has a thickness of not less than 0.2 mm and not more than 0.4 mm.

14. The insulated circuit board according to claim 10, wherein at least one of the first and second electrodes is divided into a plurality of parts at a distance from each other on the one main surface or the other main surface.

15. The insulated circuit board according to claim 10, wherein the thin portion of the at least one of the first and second electrodes includes extensions extending along the outer edges of the at least one of the first and second electrodes, at an outer edge portion along the outer edges.

16. The insulated circuit board according to claim 10, wherein at least one of the first and second electrodes includes a first layer formed so as to cover the one main surface or the other main surface, and a second layer formed so as to cover a surface of the first layer.

17. A power module comprising:

the insulated circuit board according to claim 10; and a power semiconductor element placed on a surface of the insulated circuit board.

18. A power unit comprising the power module according to claim 17 placed on a surface of a heat sink.

19. The power module according to claim 17, wherein the power semiconductor element is made of a wide band gap semiconductor.

20. The power module according to claim 19, wherein the wide band gap semiconductor is one from the group consisting of silicon carbide, a gallium nitride-based material, and diamond.

* * * * *